US008330272B2

(12) United States Patent
Haba

(10) Patent No.: US 8,330,272 B2
(45) Date of Patent: Dec. 11, 2012

(54) MICROELECTRONIC PACKAGES WITH DUAL OR MULTIPLE-ETCHED FLIP-CHIP CONNECTORS

(75) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 232 days.

(21) Appl. No.: 12/832,376

(22) Filed: Jul. 8, 2010

(65) Prior Publication Data

US 2012/0007232 A1    Jan. 12, 2012

(51) Int. Cl.
H01L 23/52    (2006.01)
H01L 23/498   (2006.01)
(52) U.S. Cl. ........ 257/737; 257/697; 257/738; 257/741; 257/778; 257/E21.499; 257/E21.509; 257/E21.589; 257/E23.068; 438/108; 438/109; 438/113; 438/125; 438/614
(58) Field of Classification Search .......... 257/697, 257/737, 738, 741, 778, E21.499, E21.509, 257/E21.589, E23.023, E23.068; 438/108, 438/109, 113, 125, 614
See application file for complete search history.

(56) References Cited

U.S. PATENT DOCUMENTS

| 4,695,870 | A | 9/1987 | Patraw |
| 4,716,049 | A | 12/1987 | Patraw |
| 4,804,132 | A | 2/1989 | DiFrancesco |
| 4,902,600 | A | 2/1990 | Tamagawa et al. |
| 4,924,353 | A | 5/1990 | Patraw |
| 4,975,079 | A | 12/1990 | Beaman et al. |
| 4,982,265 | A | 1/1991 | Watanabe et al. |
| 5,083,697 | A | 1/1992 | Difrancesco |
| 5,116,459 | A | 5/1992 | Kordus et al. |
| 5,138,438 | A | 8/1992 | Masayuki et al. |
| 5,148,265 | A | 9/1992 | Khandros et al. |
| 5,148,266 | A | 9/1992 | Khandros et al. |
| 5,189,505 | A | 2/1993 | Bartelink |
| 5,196,726 | A | 3/1993 | Nishiguchi et al. |

(Continued)

FOREIGN PATENT DOCUMENTS

DE    102006006825 A1    8/2007

(Continued)

OTHER PUBLICATIONS

International Search Report and Written Opinion for Application No. PCT/US2011/043152, dated Dec. 9, 2011.

(Continued)

*Primary Examiner* — Dao H Nguyen
(74) *Attorney, Agent, or Firm* — Lerner, David, Littenberg, Krumholz & Mentlik, LLP

(57) ABSTRACT

A packaged microelectronic element includes a microelectronic element having a front surface and a plurality of first solid metal posts extending away from the front surface. A substrate has a major surface and a plurality of conductive elements exposed at the major surface and joined to the first solid metal posts. In particular examples, the conductive elements can be bond pads or can be second posts having top surfaces and edge surfaces extending at substantial angles away therefrom. Each first solid metal post includes a base region adjacent the microelectronic element and a tip region remote from the microelectronic element, the base region and tip region having respective concave circumferential surfaces. Each first solid metal post has a horizontal dimension which is a first function of vertical location in the base region and which is a second function of vertical location in the tip region.

47 Claims, 18 Drawing Sheets

U.S. PATENT DOCUMENTS

| | | |
|---|---|---|
| 5,214,308 A | 5/1993 | Nishiguchi et al. |
| 5,324,892 A | 6/1994 | Granier et al. |
| 5,397,997 A | 3/1995 | Tuckerman et al. |
| 5,409,865 A | 4/1995 | Karnezos |
| 5,455,390 A | 10/1995 | DiStefano et al. |
| 5,518,964 A | 5/1996 | DiStefano et al. |
| 5,587,342 A | 12/1996 | Lin et al. |
| 5,615,824 A | 4/1997 | Fjelstad et al. |
| 5,656,550 A | 8/1997 | Tsuji et al. |
| 5,659,952 A | 8/1997 | Kovac et al. |
| 5,679,977 A | 10/1997 | Khandros et al. |
| 5,689,091 A | 11/1997 | Hamzehdoost et al. |
| 5,731,709 A | 3/1998 | Pastore et al. |
| 5,762,845 A | 6/1998 | Crumly |
| 5,798,286 A | 8/1998 | Faraci et al. |
| 5,802,699 A | 9/1998 | Fjelstad et al. |
| 5,811,982 A | 9/1998 | Beaman et al. |
| 5,854,507 A | 12/1998 | Miremadi et al. |
| 5,973,391 A | 10/1999 | Bischoff et al. |
| 5,980,270 A | 11/1999 | Fjelstad et al. |
| 6,001,671 A | 12/1999 | Fjelstad |
| 6,032,359 A | 3/2000 | Carroll |
| 6,052,287 A | 4/2000 | Palmer et al. |
| 6,054,756 A | 4/2000 | DiStefano et al. |
| 6,059,984 A | 5/2000 | Cohen et al. |
| 6,157,075 A | 12/2000 | Karavakis et al. |
| 6,175,159 B1 | 1/2001 | Sasaki |
| 6,177,636 B1 | 1/2001 | Fjelstad |
| 6,202,297 B1 | 3/2001 | Faraci et al. |
| 6,216,941 B1 | 4/2001 | Yokoyama et al. |
| 6,217,972 B1 | 4/2001 | Beroz et al. |
| 6,229,220 B1 | 5/2001 | Saitoh et al. |
| 6,235,996 B1 | 5/2001 | Farooq et al. |
| 6,258,625 B1 | 7/2001 | Brofman et al. |
| 6,307,260 B1 | 10/2001 | Smith et al. |
| 6,332,270 B2 | 12/2001 | Beaman et al. |
| 6,335,571 B1 | 1/2002 | Capote et al. |
| 6,358,627 B2 | 3/2002 | Benenati et al. |
| 6,362,525 B1 | 3/2002 | Rahim |
| 6,458,411 B1 | 10/2002 | Goossen et al. |
| 6,495,914 B1 | 12/2002 | Sekine et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,578,754 B1 | 6/2003 | Tung |
| 6,589,870 B1 | 7/2003 | Katoh et al. |
| 6,624,653 B1 | 9/2003 | Cram |
| 6,647,310 B1 | 11/2003 | Yi et al. |
| 6,648,213 B1 | 11/2003 | Patterson et al. |
| 6,681,982 B2 | 1/2004 | Tung |
| 6,734,539 B2 | 5/2004 | Degani et al. |
| 6,734,556 B2 | 5/2004 | Shibata |
| 6,767,819 B2 | 7/2004 | Lutz |
| 6,782,610 B1 | 8/2004 | Iijima et al. |
| 6,815,252 B2 | 11/2004 | Pendse |
| 6,852,564 B2 | 2/2005 | Ohuchi et al. |
| 6,869,750 B2 | 3/2005 | Zhang et al. |
| 6,870,274 B2 | 3/2005 | Huang et al. |
| 6,875,638 B2 | 4/2005 | Yoneda et al. |
| 6,888,255 B2 | 5/2005 | Murtuza et al. |
| 6,902,869 B2 | 6/2005 | Appelt et al. |
| 6,906,418 B2 | 6/2005 | Hiatt et al. |
| 6,956,165 B1 | 10/2005 | Hata et al. |
| 6,965,166 B2 | 11/2005 | Hikita et al. |
| 6,995,044 B2 | 2/2006 | Yoneda et al. |
| 6,995,469 B2 | 2/2006 | Hatakeyama |
| 7,043,831 B1 | 5/2006 | Farnworth et al. |
| 7,115,495 B2 | 10/2006 | Wark et al. |
| 7,125,789 B2 | 10/2006 | Tellkamp et al. |
| 7,183,190 B2 | 2/2007 | Saijo et al. |
| 7,214,887 B2 | 5/2007 | Higashida et al. |
| 7,382,049 B2 | 6/2008 | Ho et al. |
| 7,569,935 B1 | 8/2009 | Fan |
| 7,598,613 B2 | 10/2009 | Tanida et al. |
| 7,745,943 B2 | 6/2010 | Haba et al. |
| 7,829,265 B2 | 11/2010 | Kitada et al. |
| 8,115,310 B2 | 2/2012 | Masumoto et al. |
| 2001/0008309 A1 | 7/2001 | Iijima et al. |
| 2002/0056906 A1 | 5/2002 | Kajiwara et al. |
| 2002/0074641 A1 | 6/2002 | Towle et al. |
| 2002/0090756 A1 | 7/2002 | Tago et al. |
| 2002/0125571 A1 | 9/2002 | Corisis et al. |
| 2002/0153602 A1 | 10/2002 | Tay et al. |
| 2002/0185735 A1 | 12/2002 | Sakurai et al. |
| 2003/0001286 A1 | 1/2003 | Kajiwara et al. |
| 2003/0094700 A1 | 5/2003 | Aiba et al. |
| 2003/0107118 A1 | 6/2003 | Pflughaupt et al. |
| 2003/0127734 A1 | 7/2003 | Lee et al. |
| 2003/0132518 A1 | 7/2003 | Castro |
| 2003/0164540 A1 | 9/2003 | Lee et al. |
| 2003/0189260 A1 | 10/2003 | Tong et al. |
| 2003/0234453 A1 | 12/2003 | Liu et al. |
| 2004/0031972 A1 | 2/2004 | Pflughaupt et al. |
| 2004/0201096 A1 | 10/2004 | Iijima et al. |
| 2004/0245213 A1 | 12/2004 | Fukase et al. |
| 2005/0097727 A1 | 5/2005 | Iijima et al. |
| 2005/0101136 A1 | 5/2005 | Mori |
| 2005/0116326 A1 | 6/2005 | Haba et al. |
| 2005/0124091 A1 | 6/2005 | Fukase et al. |
| 2005/0285246 A1 | 12/2005 | Haba et al. |
| 2006/0091538 A1* | 5/2006 | Kabadi ............... 257/737 |
| 2006/0220259 A1 | 10/2006 | Chen et al. |
| 2007/0017090 A1 | 1/2007 | Sakai et al. |
| 2007/0045869 A1 | 3/2007 | Ho et al. |
| 2007/0164447 A1 | 7/2007 | Ho et al. |
| 2007/0230153 A1* | 10/2007 | Tanida et al. ............ 361/809 |
| 2008/0003402 A1 | 1/2008 | Haba et al. |
| 2009/0002964 A1 | 1/2009 | Haba |
| 2009/0121348 A1* | 5/2009 | Chang ............... 257/737 |
| 2009/0146303 A1 | 6/2009 | Kwon |
| 2009/0188706 A1 | 7/2009 | Endo |
| 2009/0243095 A1* | 10/2009 | Fujita et al. ............ 257/737 |
| 2009/0302466 A1* | 12/2009 | Shoji et al. ............ 257/737 |
| 2011/0074027 A1* | 3/2011 | Kwon ............... 257/737 |

FOREIGN PATENT DOCUMENTS

| | | |
|---|---|---|
| EP | 0615283 A1 | 9/1994 |
| EP | 1091406 A2 | 4/2001 |
| EP | 1255295 A1 | 11/2002 |
| EP | 1471570 A1 | 10/2004 |
| EP | 1602749 | 12/2005 |
| JP | 62-68015 A | 9/1994 |
| JP | 2001118872 A | 4/2001 |
| JP | 2002-313996 A | 10/2002 |
| WO | 0141207 A1 | 6/2001 |
| WO | 2005122706 A2 | 12/2005 |
| WO | 2006004672 A1 | 1/2006 |
| WO | 2009023283 A2 | 2/2009 |

OTHER PUBLICATIONS

Choubey A; Hao Yu; Osterman M; Pecht M; Fu Yun; Li Yonghong; Xu Ming: "Intermetallics Characterization of lead-free solder joints under isothermal aging" Journal of Electronic Materials, vol. 37, No. 8, May 28, 2008, pp. 1130-1138, XP002555807.

Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.

North Corporation, "Processed Intra-layer Interconnection Material for PWBs [Etched Copper Bump with Copper Foil]," NMBITM, Version 2001.6.

* cited by examiner

MICROELECTRONIC PACKAGES WITH DUAL OR MULTIPLE-ETCHED FLIP-CHIP CONNECTORS

BACKGROUND OF THE INVENTION

The present invention relates to microelectronic packages, to components for use in fabrication of microelectronic packages, and to methods of making the packages and components.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

In one face of the semiconductor chip is fabricated the active circuitry. To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as gold or aluminum, around 0.5 µm thick. The size of the bond pads will vary with the device type but will typically measure tens to hundreds of microns on a side.

Flip-chip interconnection is a commonly used scheme for conductively connecting bond pads on the semiconductor chip to contact pads on a substrate. In flip-chip interconnection, lumps of metal are typically placed on each bond pad. The die is then inverted so the metal lumps provide both the electrical pathway between the bond pads and the substrate as well as the mechanical attachment of the die to the substrate.

There are many variations of the flip-chip process, but one common configuration is to use solder for the lumps of metal and fusion of the solder as the method of fastening it to the bond pads and the substrate. When it melts, the solder flows to form truncated spheres.

Microcontact elements in the form of elongated posts or pins may be used to connect microelectronic packages to circuit boards and for other connections in microelectronic packaging. In some instances, microcontacts have been formed by etching a metallic structure including one or more metallic layers to form the microcontacts. The etching process limits the size of the microcontacts. Conventional etching processes typically cannot form microcontacts with a large ratio of height to maximum width, referred to herein as "aspect ratio". It has been difficult or impossible to form arrays of microcontacts with appreciable height and very small pitch or spacing between adjacent microcontacts. Moreover, the configurations of the microcontacts formed by conventional etching processes are limited.

Despite the advances that have been made in flip chip interconnections, there is still a need for improvements in order to minimize the package thickness, while enhancing joint reliability. These attributes of the present invention are achieved by the construction of the microelectronic packages as described hereinafter.

SUMMARY OF TEE INVENTION

A packaged microelectronic element includes a microelectronic element having a front surface and a plurality of solid metal posts extending away from the front surface, and a substrate having a major surface and a plurality of conductive elements exposed at the major surface. The conductive elements can be joined to the solid metal posts. Each solid metal post can include a base region adjacent the microelectronic element and a tip region, remote from the microelectronic element, the base region and tip region having respective concave circumferential surfaces. Each solid metal post can have a horizontal dimension which is a first function of vertical location in the base region and which is a second function of vertical location in the tip region.

Each solid metal post can further include at least one intermediate region located between the base region and the top region. The intermediate region can have a concave circumferential surface. The horizontal dimension of each solid metal post can be a third function of vertical location in the intermediate region. Each solid metal post can have a width in a direction of the front surface and a height extending from the front surface, wherein the height is at least half of the width.

The solid metal posts can be joined to the conductive elements with a fusible metal. The fusible metal can comprise solder. The solder can cover at least portions of edge surfaces of each solid metal post. The packaged microelectronic element can further include a plurality of conductive pads located at the front surface. Each solid metal post can extend from a respective one of the plurality of conductive pads. In one embodiment, the solder may not touch at least one of the plurality of conductive pads.

In a particular example, the solder can not touch the base region of any solid metal post. In a particular example, the solder can touch only a top surface of each solid metal post. A height of each sold metal post can be between 25% and 50% of the distance between the front surface of the microelectronic element and the major surface of the substrate. A height of each sold metal post can be at least 40% of the distance between the front surface of the microelectronic element and the major surface of the substrate.

The solid metal posts and the conductive elements can be diffusion-bonded together. The first and second functions can be substantially different. A slope of horizontal dimension versus vertical location can change abruptly at a boundary between the base and the tip regions of the solid metal posts. The solid metal posts and the conductive elements can consist essentially of copper. The conductive elements can include conductive pads, the pads being joined to the solid metal posts.

The solid metal posts can be first solid metal posts and the conductive elements can include a plurality of second solid metal posts extending above the major surface and joined to the first solid metal posts. The second posts can have top surfaces remote from the major surface of the substrate and edge surfaces extending at substantial angles away from the top surfaces. The first solid metal posts can be joined to the second solid metal posts with a fusible metal. The fusible metal can comprise solder. The solder can cover at least portions of edge surfaces of each solid metal post. The packaged microelectronic element can further include a plurality of conductive pads located at the front surface. Each first solid metal post can extend from a respective one of the plurality of conductive pads. In one embodiment, the solder may not touch at least one of the plurality of conductive pads. In a particular example, the solder can touch only a top surface of each solid metal post. The first and second solid metal posts can be diffusion-bonded together.

Each second solid metal post can include a base region adjacent the substrate and a tip region, remote from the substrate. The base region and tip region of each second solid metal post can have respective concave circumferential surfaces. Each second solid metal post can have a horizontal dimension which is a third function of vertical location in the base region and which is a fourth function of vertical location in the tip region. Each second post can have a width in a direction of the major surface and a height extending from the major surface, wherein the height is at least half of the width.

The first solid metal posts can be joined to the second solid metal posts with a fusible metal. The fusible metal can comprise solder. The solder can cover at least portions of edge surfaces of each solid metal post. In a particular example, the solder can not touch the base region of any solid metal post. In a particular example, the solder can touch only a top surface of each solid metal post. The packaged microelectronic element can further include a plurality of conductive pads located at the front surface. Each first solid metal post can extend from a respective one of the plurality of conductive pads. In one embodiment, the solder may not touch at least one of the plurality of conductive pads. The first and second solid metal posts can be diffusion-bonded together. The first function can be the same as the third function and the second function can be the same as the fourth function.

A packaged microelectronic element includes a microelectronic element having a front surface and a plurality of first solid metal posts projecting above the front surface, and a substrate having a major surface and a plurality of second solid metal posts extending from the major surface and joined to the first solid metal posts. The first posts can have top surfaces remote from the front surface and edge surfaces extending at substantial angles away from the front surface. Each second solid metal post can include a base region adjacent the microelectronic element and a tip region, remote from the microelectronic element. The base region and tip region can have respective concave circumferential surfaces. Each second solid metal post can have a horizontal dimension which is a first function of vertical location in the base region and which is a second function of vertical location in the tip region.

Each first post can have a frustoconical shape. Each second post can have a width in a direction of the major surface and a height extending from the major surface, wherein the height is at least half of the width. The first solid metal posts can be joined to the second solid metal posts with a fusible metal. The fusible metal can comprise solder. The solder can cover at least portions of edge surfaces of each solid metal post. The packaged microelectronic element can further include a plurality of conductive pads located at the front surface. Each first solid metal post can extend from a respective one of the plurality of conductive pads. In one embodiment, the solder may not touch at least one of the plurality of conductive pads. In a particular example, the solder can touch only a top surface of each solid metal post. The first and second solid metal posts can be diffusion-bonded together.

A method of assembling a packaged microelectronic element includes the steps of providing a microelectronic element having a front surface and a plurality of solid metal posts projecting in a vertical direction above the front surface, at least substantially aligning the plurality of solid metal posts with a plurality of conductive elements exposed at a major surface of a substrate, and joining the solid metal posts of the microelectronic element with the conductive elements of the substrate. Each solid metal post can include a base region adjacent the front surface and a tip region, remote from the front surface. The base region and the tip region can have respective concave circumferential surfaces. Each solid metal post can have a horizontal dimension which is a first function of vertical location in the base region and which is a second function of vertical location in the tip region.

The joining step of the method of assembling a packaged microelectronic element can include heating a fusible metal to a melting temperature, wherein the fusible metal flows onto exposed portions of edge surfaces of the solid metal posts. The fusible method can comprise solder. The solder can cover at least portions of edge surfaces of each solid metal post. The packaged microelectronic element can further include a plurality of conductive pads located at the front surface. Each solid metal post can extend from a respective one of the plurality of conductive pads. In one embodiment, the solder may not touch at least one of the plurality of conductive pads. In a particular example, the solder can not touch the base region of any solid metal post. In a particular example, the solder can touch only a top surface of each solid metal post. A height of each sold metal post can be between 25% and 50% of the distance between the front surface of the microelectronic element and the major surface of the substrate. A height of each sold metal post can be at least 40% of the distance between the front surface of the microelectronic element and the major surface of the substrate. A passivation layer and an underbump metallization layer can be deposited over the microelectronic element.

DETAILED DESCRIPTION

Figure 1A:
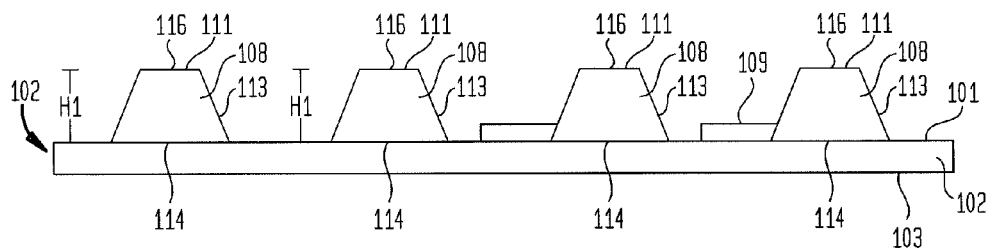
FIGS. 1A and 1B are sectional views of the components of a microelectronic assembly in accordance with one embodiment.
Figure 1B:
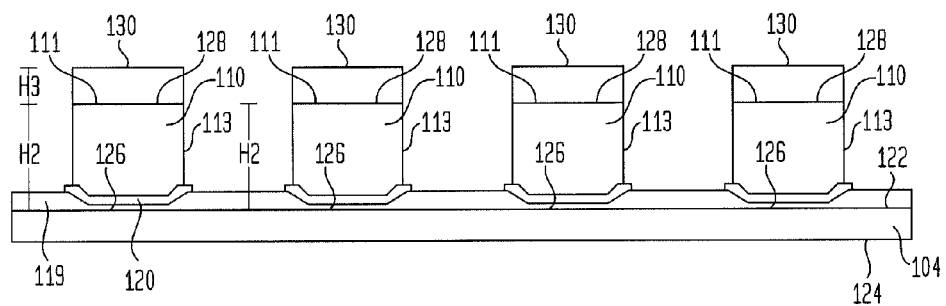
Figure 1C:
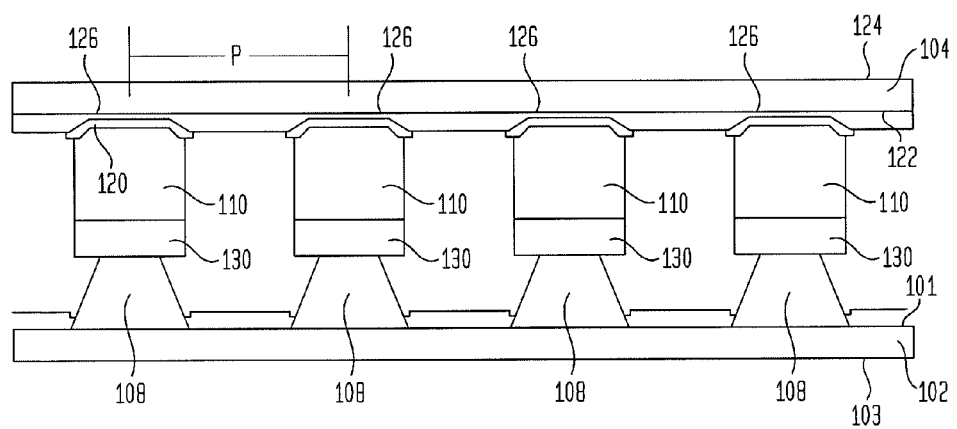
FIG. 1C is a sectional view illustrating FIGS. 1A and 1B being joined together.
Figure 2:
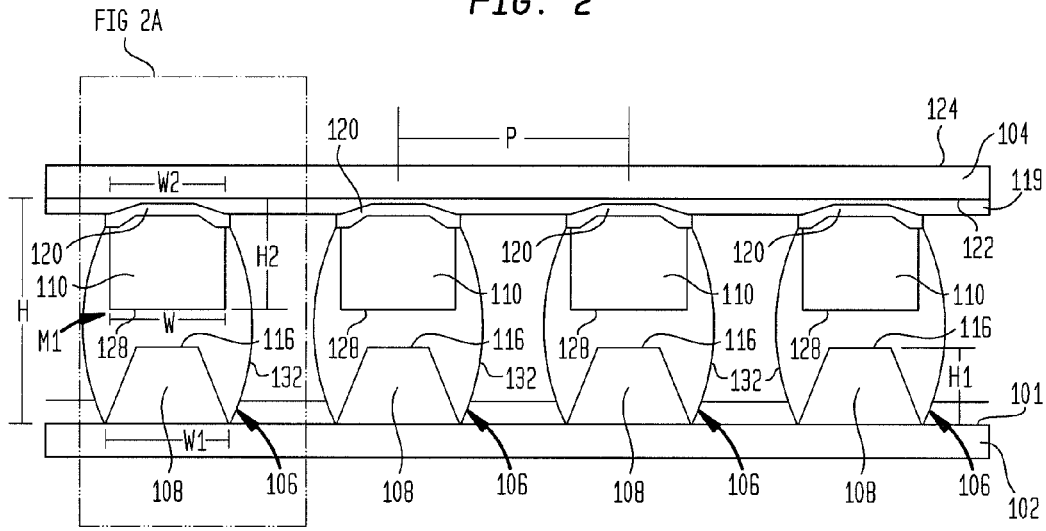
FIG. 2 is a sectional view illustrating a microelectronic assembly in accordance with the embodiment of FIGS. 1A-1C.

Reference is now made to FIGS. 1A-1C, which illustrate cross-sectional views of the components of the packaged microelectronic assembly 100 shown in FIG. 2. As shown, the packaged microelectronic assembly 100 includes a substrate 102, a microelectronic element 104 in a face down or flip-chip position, and conductive columns 106 joining the substrate with the microelectronic element. The conductive columns include conductive bumps or posts 108 which protrude above a face 105 of the substrate 102 that are aligned with conductive bumps or posts 110 protruding above a face 107 of the microelectronic element 104. The conductive columns 106 provide for increased height for chip-on-substrate packaging by increasing the standoff or vertical distance between the microelectronic element 104 and substrate 102, while at the same time allowing for a decrease in the center-to-center horizontal distance or pitch P between conductive columns 106. As will be discussed in further detail below, the ability to increase the distance between the substrate 102 and the microelectronic element 104 may help reduce stress at the conductive columns, may help ease the application of underfill material 112 (see FIG. 2A), and allow for a greater variety of underfills to be used.

With reference to FIG. 1A, the substrate 102 preferably includes a dielectric element 102A. The dielectric element 102A having a top surface 101 and an oppositely facing bottom surface 103. A plurality of conductive traces 109 may extend along the top or bottom surfaces or both. The dielectric element 102A may be rigid or flexible. The dielectric element 102 may be comprised of a polyimide or other polymeric sheet. Although the thickness of the dielectric element 102 may vary, the dielectric element 102A most typically is up to 2 millimeters thick. The substrate 102 may include other conductive elements such as external contacts (not shown) exposed at the bottom surface 103. As used in this disclosure, a conductive element "exposed at" a surface of a dielectric element may be flush with such surface; recessed relative to such surface; or protruding from such surface, so long as the conductive element is accessible for contact by a theoretical point moving towards the surface in a direction perpendicular to the surface.

The traces and contacts may be created using the methods illustrated in commonly assigned Published U.S. application Ser. No. 11/014,439, the disclosure of which is hereby incorporated by reference herein. In the particular embodiment illustrated, the conductive elements (not shown) are disposed on the top surface 101 of substrate 102. However, in other embodiments, the conductive elements may also extend along the bottom surface 103 of substrate 102; on both the top and bottom surfaces 101, 103 or within the interior of the substrate 102. Thus, as used in this disclosure, a statement that a first feature is disposed "on" a second feature should not be understood as requiring that the first feature lie on a surface of the second feature. As used herein in relation to a substrate to which the microelectronic element is to be electrically connected via posts, "top surface" and "bottom surface" are to be understood in relation to their placement relative to the microelectronic element, rather than in an gravitational frame of reference. Thus, a "top surface" shall mean a surface of the substrate adjacent to the front surface of the microelectronic element at which contacts, e.g., bond pads, metal posts, etc. are exposed. The "bottom surface" shall mean the surface of the substrate which is remote from the top surface. The bottom surface typically is a surface of the substrate on which contacts are exposed which can be joined with terminals of another element external to the packaged microelectronic element, such as a circuit panel. As used in this disclosure, a "major surface" of a substrate shall mean a "top surface" of the substrate.

Figure 2A:
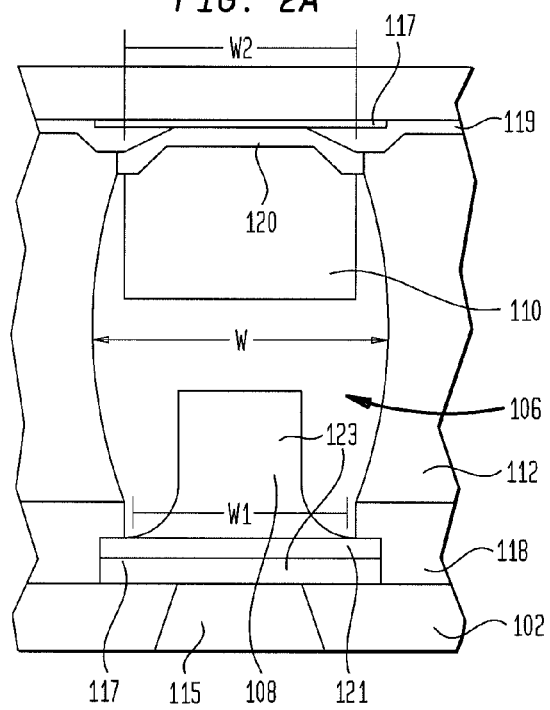
FIG. 2A is an exploded sectional view of a portion of FIG. 2.

Solid metal bumps or conductive posts 108 also extend from the top surface 101 of the substrate 102 to form the first portion of the conductive columns 106 (FIGS. 2 and 2A). The conductive posts 108 have top surfaces 111 and edge surfaces 113 extending at substantial angles away from the top surface of the substrate 102 such that a distinct angle is created where the edge surfaces 113 meet the top surfaces 101 of the substrate 102. For example, in the embodiment shown, an angle greater than 90 degrees is created between the top surfaces 101 of the substrate 102 and the edge surfaces 113 of the conductive posts 108. The angle will differ based upon the shape of the conductive post 108. For example, a cylindrical post may have an angle of 90 degrees between the top surface 101 of the substrate 102 and the conductive post 108. Exemplary processes and posts are described in Provisional Applications Nos. 60/875,730, filed on Dec. 19, 2006, and entitled Chip Capacitor Embedded PWB; 60/964,916, filed on Aug. 15, 2007, and entitled Multilayer Substrate with Interconnection Vias and Method of Manufacturing the Same; 60/964,823 filed on Aug. 15, 2007, and entitled Interconnection Element with Posts Formed by Plating; the disclosures all of which are incorporated herein by reference. For example, the conductive posts 108 may be formed by etching processes, as described in more detail herein. Alternatively, conductive posts 108 may be formed by electroplating, in which posts

108 are formed by plating a metal onto a base metal layer through openings patterned in a dielectric layer such as a photoresist layer.

The dimensions of the conductive posts 108 can vary over a significant range, but most typically the height H1 of each conductive post 108 extending from the top surface 103 of dielectric element 102A is at least 50 microns and can extend up to 300 micrometers. These conductive posts 108 may have a height H1 that is greater than its diameter or width W1. However, the height H1 may also be smaller than the width W1, such as at least half the size of the width W1.

The conductive posts 108 may be made from any electrically conductive material, such as copper, copper alloys, gold and combinations thereof. The conductive posts 108 may include at least an exposed metal layer that is wettable by solder. For example, the posts may be comprised of copper with a layer of gold at the surfaces of the posts. Additionally, the conductive posts 108 may include at least one layer of metal having a melting temperature that is greater than a melting temperature of the solder to which it will be joined. For example, such conductive posts 108 would include a layer of copper or be formed entirely of copper.

The conductive posts 108 may also take on many different shapes, including frustoconical. The base 114 and tip 116 of each of the conductive posts 108 may be substantially circular or have a different shape, e.g. oblong. The bases 114 of the conductive posts 108 typically are about 50-300 μm in diameter, whereas the tips 116 typically are about 25-200 μm in diameter. Each conductive post 108 may have a base 114 adjacent the dielectric substrate 102 and a tip 116 remote from the dielectric substrate. Additionally, the height H1 of the conductive posts from the top surface 101 of the dielectric element 102A (excluding any solder mask) typically ranges from as little as 30 μm up to 200 μm.

As shown, solder mask 118 (FIG. 2) may be disposed over the substrate 102 and adjacent the conductive posts 108. The solder mask 118 helps to prevent solder overflow and bridging between adjacent columns 106 during the reflow phase.

Referring to FIG. 1B, the microelectronic element 104 has a front surface 122 and a rear surface 124. The microelectronic element 104 is preferably a semiconductor chip or the like prior to its packaging and interconnection with another element. For example, the microelectronic element is a bare die.

Exemplary conductive posts and methods of making conductive posts capable of extending from a microelectronic element or the like are described on the website of Advanpak Solutions Pte. Ltd. ("Advanpak"), as well as in U.S. Pat. Nos. 6,681,982; 6,592,109; and 6,578,754 that are assigned to Advanpak, and the disclosures of which are incorporated herein by reference. For example, the conductive posts 110 may be formed by etching processes. Alternatively, conductive posts 110 may be formed by electroplating, in which posts 110 are formed by plating a metal onto a base metal layer through openings patterned in a photoresist layer. Like the conductive posts 108 extending from the substrate, the posts 110 extending from the microelectronic element 104 may have top surfaces 111 and edge surfaces 113 extending at substantial angles away from the top surface 122 of the microelectronic element such that a distinct angle is created between the microelectronic element and the conductive posts.

To provide a metal contact between the conductive posts 110 and the microelectronic element 104, an underbump metallization layer 120 may be provided on the front surface 122 of the microelectronic element 104. The underbump metallization layer 120, is typically composed of a material including titanium, titanium-tungsten, chromium. The underbump metallization layer 120 operates as the conducting metal contact for the conductive columns 106. A passivation layer 119 may also be provided on the front surface 122 of the microelectronic element 104 between the microelectronic element 104 and the underbump metallization layer 120 using known methods in the art.

Referring to FIGS. 1B, 1C, and 2, the dimensions of the conductive posts 110 extending from the microelectronic element 104 may also vary over a significant range, but most typically the height H2 of each conductive post 110 is not less than 50 microns. The conductive posts 110 may have a height H2 that is greater than its width W2. However, the height may also be smaller than the width W2, such as at least half the size of the width.

The conductive posts 110 are preferably made from copper or copper alloys, but may also include other electrically conductive materials, such as gold or combinations of gold and copper. Additionally, the conductive posts 110 may include at least one layer of metal having a melting temperature that is greater than a melting temperature of the solder to which it will be joined. For example, such conductive posts would include a layer of copper or be formed entirely of copper.

In a particular embodiment, the conductive posts 110 can be cylindrical, so that the diameter of the bases 126 of the post and tips 128 of the posts are substantially equal. In one embodiment, the bases 126 and tips 128 of the conductive posts can be about 30-150 μm in diameter. Each conductive post 110 may have a base 126 adjacent the substrate 102 and a tip 128 remote from the substrate 102. Alternatively, the conductive posts 110 may take on a variety of shapes, such as frustoconical, rectangular, or bar-shaped.

A coating or cap of solder 130 may be attached to the tips 128 of the conductive posts 110 or the portion of the conductive posts that are not attached to the microelectronic element 104. The cap of solder 130 can have the same diameter or width W2 of the conductive posts 110 so that it becomes an extension of the conductive post 110. In one example, the cap of solder 130 can have a height H3 ranging from approximately 25-80 μm.

It should be appreciated that the height H2 of the conductive posts 110 extending from the front surface 122 of the microelectronic element 104 can be equal to the height H1 of the conductive posts 108 extending from the top surface 101 of the dielectric element 102A (FIG. 1A). However, the heights may alternatively differ, such that the height H2 of the conductive posts 110 can be less than or greater than the height H1 of the conductive posts 108. In a particular illustrative example, the conductive posts 110 extending from the microelectronic element 104 may have a height H2 of 50 μm in length, whereas the conductive posts 108 extending from the substrate may have a height H1 of 55 μm (FIG. 2).

To conductively connect the microelectronic element 104 and substrate 102 together, the conductive posts 110 on the microelectronic element 104 must be connected to the conductive posts 108 on the substrate 102. Referring to FIG. 1C, the microelectronic element 104 is inverted so that the conductive posts 110 of the microelectronic element 104 and the conductive posts 108 of the substrate 102 are aligned with one another and brought into close proximity. The cap of solder 130 on the microelectronic element 104 is reflowed to allow the solder to wet the surfaces of the conductive posts 110 on the microelectronic element 104 and the conductive posts 108 on the substrate 102. As shown in FIGS. 2-2A, the solder will wet to the exposed surfaces of the conductive posts and create a conductive column 106 that extends from the microelectronic element to the substrate. The increased surface areas of the conductive columns 108, 110 on the microelectronic element 104 and substrate 102 to which the solder is joined can help reduce the current density at the solder interface. Such decrease in current density may help reduce electromigration and provide for greater durability.

As shown, the conductive columns 106 include solder conductively interconnecting the conductive posts. The standoff or height H of the conductive columns extending between the base of the conductive post extending from the microelectronic element and the exposed portions of the base extending from the substrate in one example ranges 80-100 μm.

As shown in FIGS. 2, 2A, the walls 132 of the conductive columns 106 can be convex or barrel shaped, wherein the midpoint region M of the conductive column (i.e., between the conductive posts 110 of the microelectronic element and conductive posts 108 of the substrate) has a width W that is greater than the widths W1, W2 of the portions of the conductive columns 106 respectively adjacent the top surface 101 of the substrate 102 and front surface 102 of the microelectronic element 104.

As further shown in FIG. 2A, contact pads 117 may be formed on the microelectronic element 104 and substrate 102 using known methods. In one embodiment, the lower post 108 that extends away from the substrate 102, as well as the lower contact pad 117 may be formed by separate etching steps, such as disclosed in International Application PCT No. WO 2008/076428, which published on Jun. 28, 2008 and the disclosure of which is incorporated herein by reference. For example, a tri-metal substrate with top and bottom metal layers 123 and in intermediate etch stop layer or interior metal layer 121 may be utilized to create the conductive post 108 and contact pad 117. In one such process, an exposed metal layer of a three-layer or more layered metal structure is etched in accordance with a photolithographically patterned photoresist layer to form the conductive post 108, the etching process stopping on an interior metal layer 121 of the structure. The interior metal layer 121 includes one or more metals different from that of the top and bottom metal layers 123, the interior metal layer being of such composition that it is not attached by the etchant used to etch the top metal layer 123. For example, the top metal layer 123 from which the conductive posts 108 are etched consists essentially of copper, the bottom metal layer 123 may also consist essentially of copper, and the interior metal layer 121 consists essentially of nickel. Nickel provides good selectivity relative to copper to avoid the nickel layer from being attached with the metal layer is etched to form conductive posts 108. To form the contact pad 117, another etching step may be conducted in accordance with another photolithographically patterned photoresist layer. The post 108 may be further interconnected with other conductive features such as a via 115, which is, in turn, further interconnected to other conductive features (not shown).

Figure 3:
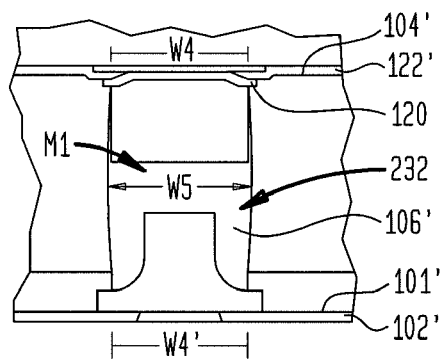
FIG. 3 is a sectional view illustrating a completed microelectronic assembly in accordance with a variation of the embodiment shown in FIG. 2.
Figure 4:
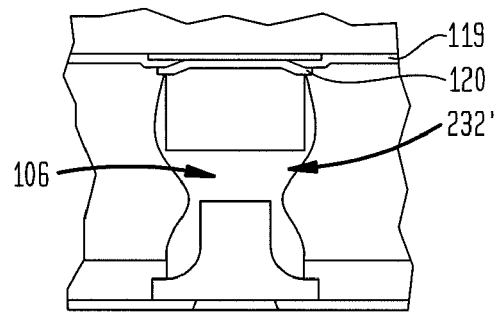
FIG. 4 is a sectional view illustrating a completed microelectronic assembly in accordance with in accordance with a variation of the embodiment shown in FIG. 2.

Referring to FIG. 3, the walls 232 of the conductive columns 106' may also be straight, such that the width W5 is about equal to the widths W4, W4' of the conductive columns 106' respectively adjacent the top surface 101' of the substrate 102' and front surface 122' of the microelectronic element 104'. It should be appreciated that the widths W4, W4' do not need to be equal. Alternatively, the walls 232' of the conductive columns 106' may be concave (see FIG. 4), depending on the desired standoff to be achieved.

The conductive columns 106 in accordance with the present invention allow for a greater standoff height between the dielectric element and the microelectronic element while permitting a significant reduction in the pitch P (see FIGS. 1B, 2) between each of the conductive posts 110 exposed at the front surface 122 of the microelectronic element 104, as well as the pitch P between each of the conductive posts 108 exposed at the top surface 101 of the substrate 102. In one embodiment, the pitch P may be as small as 50 μm or as large as 200 μm. It should be appreciated that by virtue of the fact that the conductive columns 108, 110 are aligned with one another, the pitch P between each of the conductive posts 108, 110 will be equal.

The pitch P may also be a function of the diameter or width W1, W2 of the conductive posts 108, 110, such that the diameter W1, W2 of the base of the conductive posts is up to 75% of the pitch P. In other words, the ratio of the diameter W1, W2 to the pitch P can be up to 3:4. For example, if the pitch P is 145 μm, the diameter W1, W2 of the conductive posts 108, 110 may range up to 108 μm or 75% of the pitch P.

The increased standoff height reduces the strain on Low-k dielectric materials which can be present in the microelectronic element. Additionally, the increased standoff helps to minimize the problems typically associated with small pitches, such as electromigration and crowding. This is due to the fact that the conductive columns 106 are able to wet the surfaces of the conductive posts 108, 110.

Figure 5:
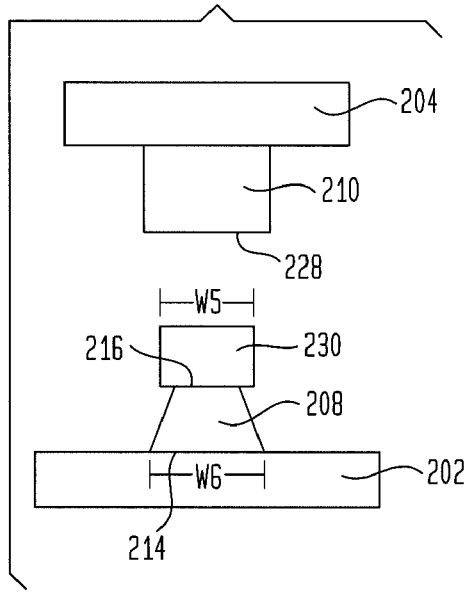
FIG. 5 is a sectional view illustrating the components of a microelectronic assembly in accordance with another embodiment.
Figure 6:
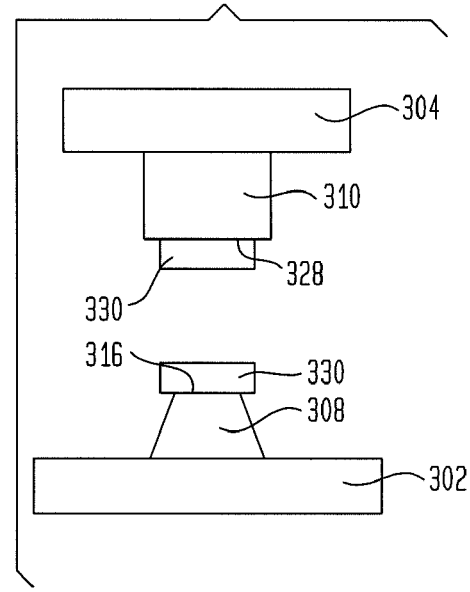
FIG. 6 is a sectional view illustrating components of a microelectronic assembly in accordance with a variation of the embodiment shown in FIG. 5.

Referring to FIGS. 5-6, alternative arrangements for joining the conductive bumps on the microelectronic element with the conductive bumps on the substrate are shown. With reference to FIG. 5, instead of the solder cap 230 being placed at the tip 228 of the conductive post 210 extending from the microelectronic element 204, the solder cap 230 can be placed at the tip 216 of the conductive post 208 extending from the substrate 202. In one embodiment, the width or diameter W5 of the solder cap 230 is roughly equal to the diameter W6 of the base 214 of the conductive post 208. The solder cap 230 therefore extends beyond the tip 216 of the conductive post 208 extends from the substrate 202. Once the solder is reflowed, however, the conductive column will preferably take the shape of the conductive column shown in FIG. 2.

Referring to FIG. 6, in yet another alternative arrangement, solder caps 330 may be placed onto the conductive posts 310, 308 extending from both the microelectronic element 304 and the substrate 302. The conductive posts 308, 310 are placed in close proximity to one another. Heat is applied causing the solder caps 330 to reflow, wet, and fuse to the conductive posts 308, 310. Once reflowed, the conductive column 306 will preferably be similar to the conductive column 306 shown in FIG. 2.

Figure 7:
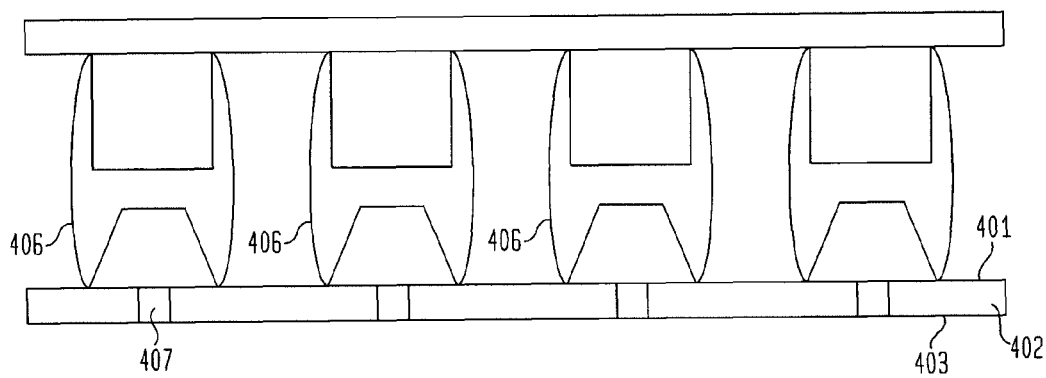
FIG. 7 is a sectional view illustrating a completed microelectronic assembly in accordance with one embodiment.

With reference to FIG. 7, an alternative arrangement for a microelectronic package is shown. The arrangement is similar to the one shown in FIG. 2, the only difference being the absence of a solder mask adjacent the conductive posts extending from the substrate. In this alternative arrangement, vias 307 can be used to conductively connect the conductive columns 406 to electronic circuitry (not shown) exposed at the bottom surface of the substrate 402, as opposed to the top surface 401 of the substrate 402. The use of vias 307 obviates the need for the solder mask.

Figure 8:
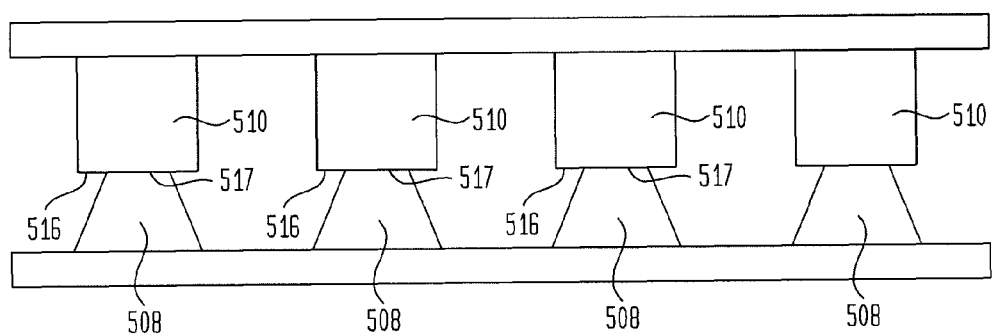
FIG. 8 is a sectional view illustrating a completed microelectronic assembly in accordance with another embodiment.

Referring to FIG. 8, an alternative embodiment is shown, wherein a metal-to-metal bond between the conductive posts is made without the use of solder. Instead, a bond may be formed between the conductive posts 508, 510 by deforming them into engagement with each other. The conductive posts 508, 510 are preferably formed from a malleable material with minimal resilience or spring-back as, for example, substantially pure gold. Furthermore, the conductive posts 508, 510 may be bonded together by eutectic bonding or anodic bonding between the posts and the material of the cover. For example, the tips 516, S17 of the conductive posts 508, 510 may be coated with a small amount of tin, silicon, germanium or other material which forms a relatively low-melting alloy with gold, and the posts may be formed entirely from gold or have a gold coating on their surfaces. When the conductive posts 508, 510 are engaged with one another and then heated, diffusion between the material of conductive posts 508, 510 and the material on the tips 516 of the conductive posts forms an alloy having a melting point lower than the melting points of the individual elements at the interfaces between the posts and walls. With the assembly held at elevated temperature, further diffusion causes the alloying element to diffuse away from the interface, into the bulk of the gold of the posts, thereby raising the melting temperature of the material at the interface and causing the interface to freeze, forming a solid connection between the parts.

Figure 9:
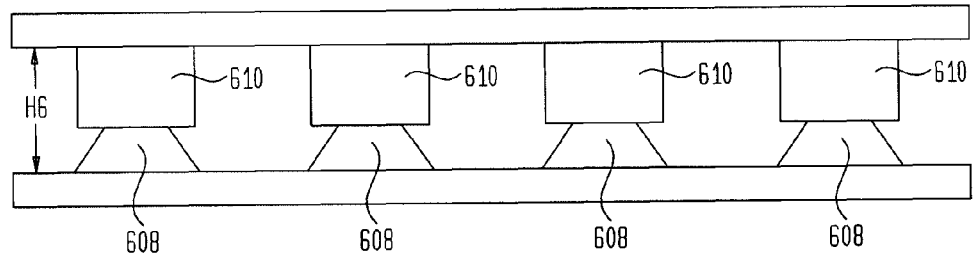
FIG. 9 is a sectional view illustrating a completed microelectronic assembly in accordance with another embodiment.

Referring to FIG. 9, which is identical to FIG. 8, except that the conductive posts 608, 610 are both preferably comprised of copper and are fused directly to one another without the presence of a low melting temperature metal such as a solder or tin between the conductive posts. Preferably, in order to achieve a strong bond, the joining surfaces of the conductive posts 608, 610 must be clean and substantially free of oxides, e.g., native oxides, before the conductive posts 608, 610 are joined to the terminals. Typically, a process characterized as a surface treatment of etching or micro-etching can be performed to remove surface oxides of noble metals such as copper, nickel, aluminum, and others, the surface etching process being performed without substantially affecting the thicknesses of the bumps or metal layer which underlies them. This cleaning process is best performed only shortly before the actual joining process. Under conditions in which the component parts are maintained after cleaning in a normal humidity environment of between about 30 to 70 percent relative humidity, the cleaning process can usually be performed up to a few hours, e.g., six hours, before the joining process without affecting the strength of the bond to be achieved between the bumps and the capacitor terminals.

Figure 10:
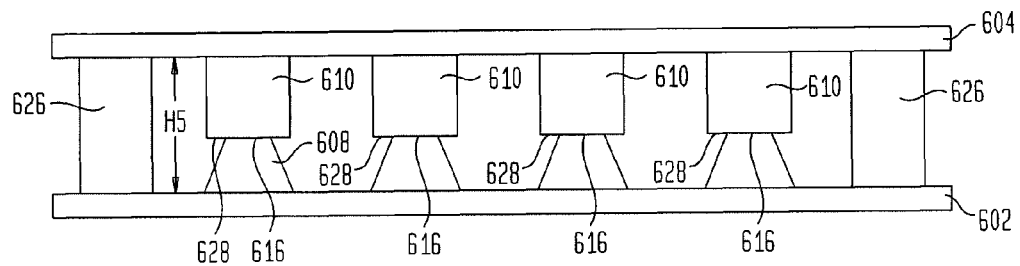
FIG. 10 is a sectional view illustrating a completed microelectronic assembly in accordance with another embodiment.
Figure 11:
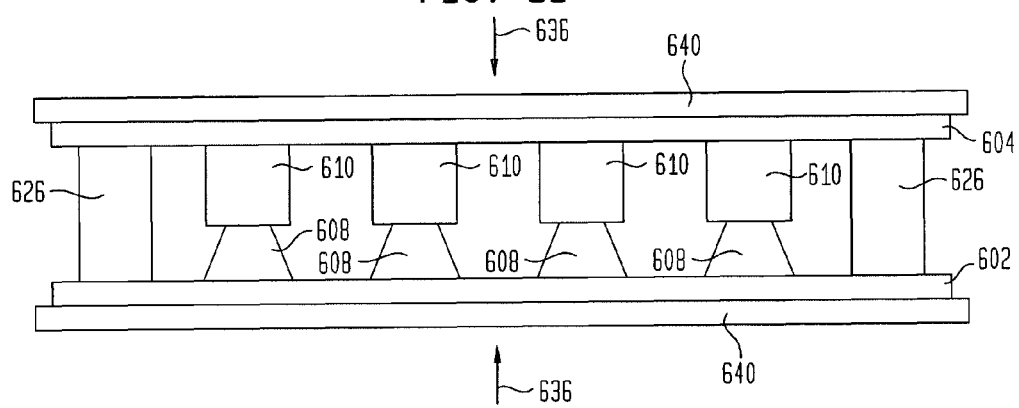
FIG. 11 is a sectional view illustrating a completed microelectronic assembly in accordance with another embodiment.

As illustrated in FIGS. 10-11, during a process performed to join the conductive posts 608, 610, a spacer structure 726 is placed on the top surface 601 of the substrate 602. The spacer structure 626 can be formed of one or more materials such as polyimide, ceramic or one or more metals such as copper. The microelectronic element 604 from which conductive posts 610 extend are placed above the spacer structure 626, such that the tips 628 of the conductive posts 610 of the microelectronic element 604 overlie the tips 616 of the conductive posts 608 of the substrate 602. Referring to FIG. 10, the spacer structure 626, microelectronic element 604 and substrate 602 are inserted between a pair of plates 640 and heat and pressure are simultaneously applied to the conductive posts in the directions indicated by arrows 636. As illustrated in FIG. 9, the pressure applied to plates 640 has an effect of reducing the height of the conductive posts to a height H6 lower than an original height H5 of the conductive posts 608, 610 as originally fabricated (FIG. 10). An exemplary range of pressure applied to during this step is between about 20 kg/cm2 and about 150 kg/cm2. The joining process is performed at a temperature which ranges between about 140 degrees centigrade and about 500 degrees centigrade, for example.

The joining process compresses the conductive posts 608, 610 to an extent that metal from below the former top surfaces of the conductive posts 608, 610 comes into contact and joins under heat and pressure. As a result of the joining process, the height of the conductive posts 608, 610 may decrease by one micron or more. When the conductive posts 608, 610 consist essentially of copper, the joints between the conductive posts also consist essentially of copper, thus forming continuous copper structures including the bumps and terminals. Thereafter, as illustrated in FIG. 9, the plates and spacer structure are removed, leaving a subassembly 250 having conductive columns 606 formed from the conductive joinder of the conductive posts 608, 610.

Figure 12:
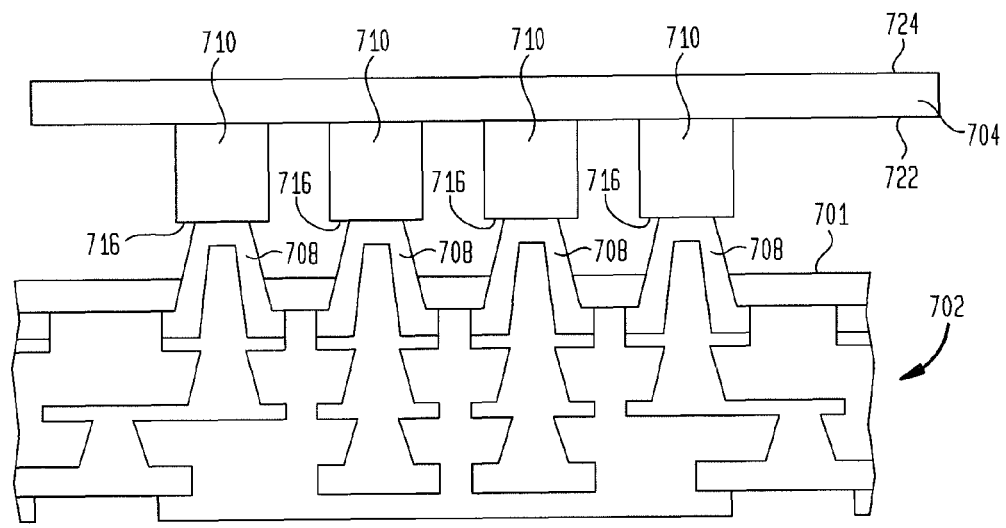
FIG. 12 is a sectional view illustrating a completed microelectronic assembly in accordance with another embodiment.

Referring to FIG. 12, another alternative embodiment in accordance with the present invention is shown. The only difference here is that instead of a single layer substrate, a multilayer substrate may be used, such as the multilayer substrates described in U.S. appln. No. 60/964,823, filed on Aug. 15, 2007, and entitled Interconnection Element with Posts Formed by Plating; U.S. Appln. No. 60/964,916 filed Aug. 15, 2007, and entitled Multilayer Substrate With Interconnection Vias and Method of Manufacturing the Same; and U.S. patent application Ser. No. 11/824,484, filed on Jun. 29, 2007, and entitled Multilayer Wiring Element Having Pin Interface, the disclosures of which are incorporated herein. As shown, the multilayer substrate 702 is joined in flip-chip manner with a microelectronic element 704, e.g., a semiconductor chip having active devices, passive devices, or both active and passive devices thereon. The tips 716 of the conductive posts 710, which protrude from the top surface 701 of the multilayer substrate, are joined as described herein to conductive posts 710 extending from the microelectronic element. As shown, the conductive posts 708 of the multilayer substrate 702 can be joined directly to the conductive posts 710 extending from the front surface microelectronic element, such as through a diffusion bond formed between a finished metal at the tips 160 of the posts, e.g., gold, and another metal present in the conductive pads and the posts. Alternatively, the conductive posts 708, 710 posts can be joined together through a fusible metal such as a solder, tin or a eutectic composition, the fusible metal wetting the posts and the pads to form wetted or soldered joints. For example, the fusible metal can be provided in form of solder bumps (not shown), exposed at a front surface 722 of the microelectronic element 704, the bumps being provided at the ends of either or both of the tips of the conductive posts.

The conductive columns may also be utilized in stacked packaging, such as those packages described in commonly owned applications U.S. Appln. No. 60/963,209, filed Aug. 3, 2007, and entitled Die Stack Package Fabricated at the Wafer Level with Pad Extensions Applied To Reconstituted Wafer Elements; U.S. Appln. No. 60/964,069, filed Aug. 9, 2007, and entitled Wafer Level Stacked Packages with Individual Chip Selection; U.S. Appln. No. 60/962,200, filed Jul. 27, 2007, and entitled Reconstituted Wafer Stack Packaging with After-Applied Pad Extensions; and U.S. Appln. No. 60/936, 617, filed Jun. 20, 2007, and entitled Reconstituted Wafer Level Stacking.

Figure 13:
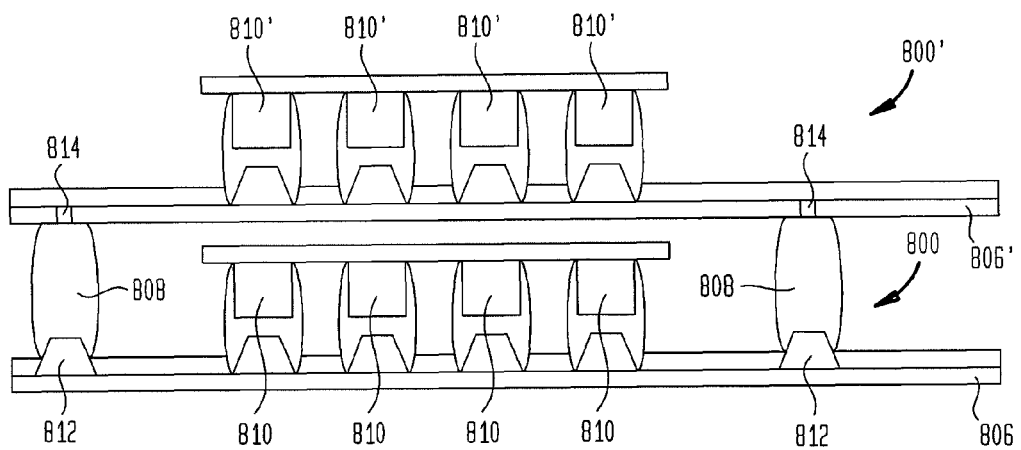
FIG. 13 is a sectional view illustrating a completed microelectronic assembly in accordance with another embodiment.

For example, with reference to FIG. 13, in an alternative embodiment, a stacked package assembly includes a first subassembly 800 and a second subassembly 802. The first and second subassemblies are virtually identical to the packaged microelectronic element shown in FIG. 2, except for the fact that the substrates 806, 806' extend further out to accommodate conductive columns 808 extending between the substrates 806, 806' of the first and second subassemblies. The conductive columns 808 also include a conductive post 812 extending from the substrate that connects to vias 814 extending through the top and bottom surfaces of the substrate on the second subassembly.

Figure 14:
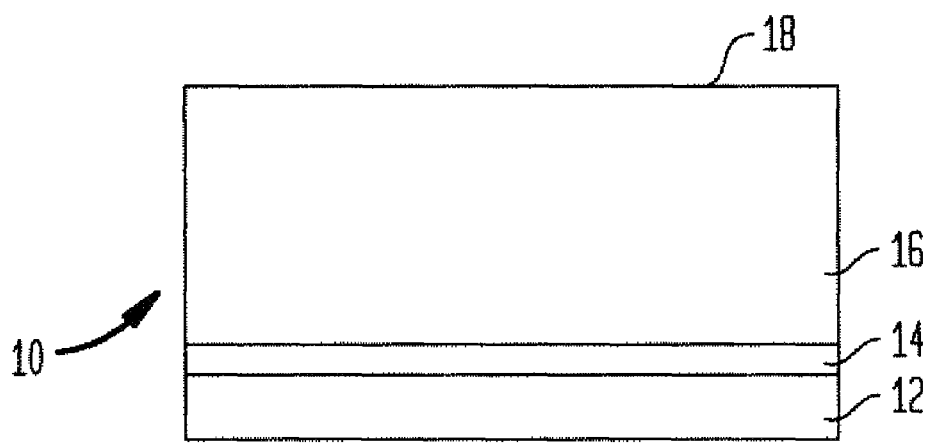
FIG. 14 is a schematic illustration of a substrate.

FIG. 14 is a schematic illustration of a tri-metal substrate 10. The tri-metal substrate 10 has a trace layer 12, an etch stop layer 14, a thick layer 16, and a top surface 18. The trace layer 12 and the thick layer 16 may be formed of a readily etchable first metal such as copper, while the etch stop layer 14 may be formed of a metal, such as nickel, which is substantially resistant to etching by a process used to etch copper. Although, copper and nickel are recited, the substrate 10 may be formed of any suitable material as desired.

Figure 15:
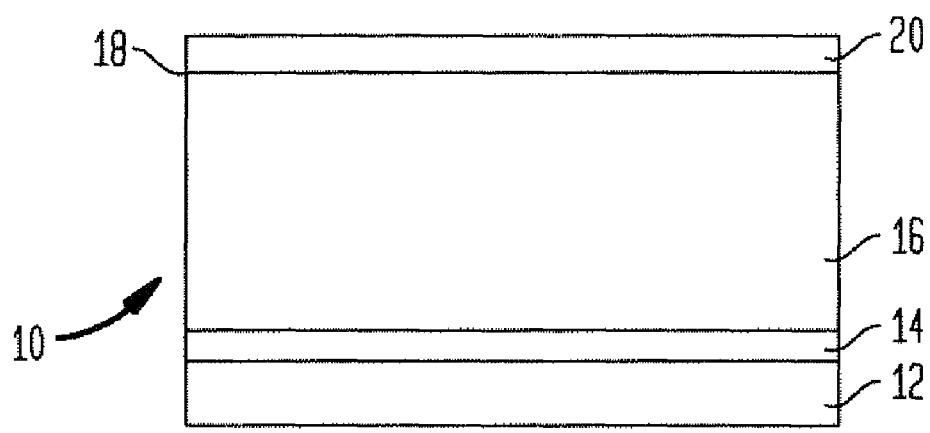
FIG. 15 is a schematic illustration of the substrate of FIG. 14 with a layer of photoresist.

FIG. 15 is a schematic illustration of the tri-metal substrate 10 of FIG. 14 with a layer of a first photoresist 20. The first photoresist 20 is deposited onto the top surface 18. The first photoresist 20 may be any type of material that hardens or undergoes a chemical reaction when exposed to radiation such as light. Thus, any etch-resistant material maybe used. Positive and negative photoresists may also be utilized and are known in the art.

Figure 16:
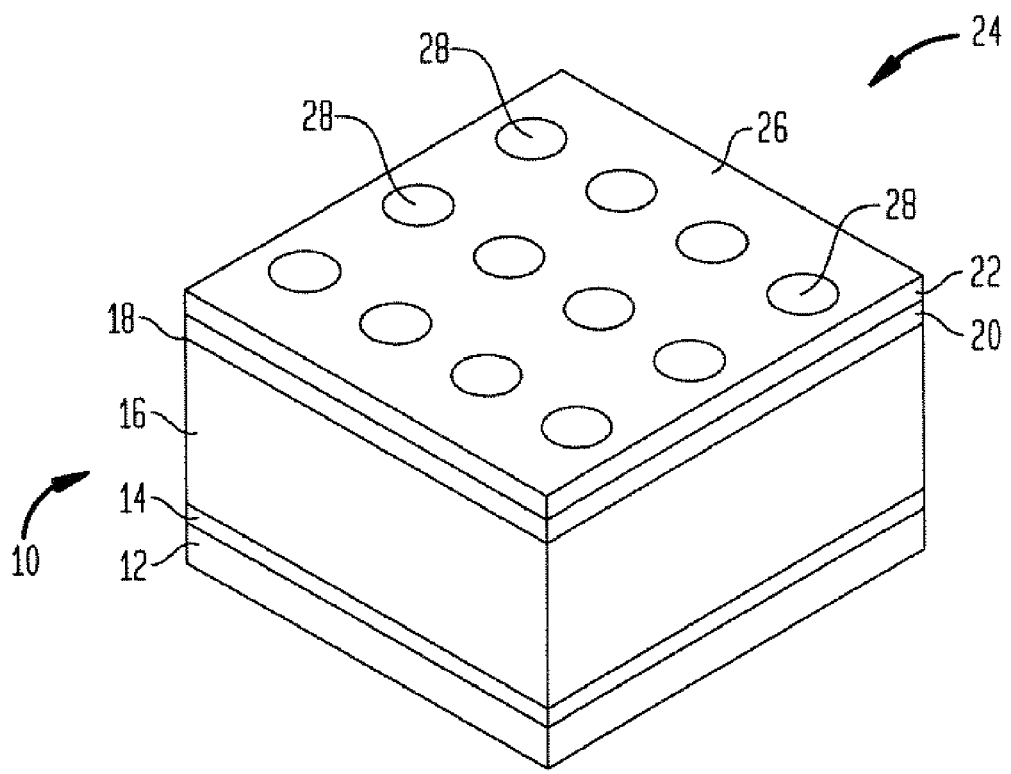
FIG. 16 is a perspective schematic illustration of the substrate of FIG. 14 with a layer of photoresist and a mask.

FIG. 16 is a perspective schematic illustration of the tri-metal substrate of FIG. 14 with the layer of first photoresist 20 and a mask 22. The mask 22 is often a transparent plate with opaque areas printed on it called a photomask or shadow-mask, creating a pattern 24 on the mask 22 with areas covered by the mask 22, denoted by reference numeral 26, and areas not covered by the mask 22, denoted by reference numeral 28. The pattern 24 with the covered and uncovered areas, 26 and 28, respectively, allows for selectively exposing parts of the first photoresist 20 to radiation.

Once the mask 22 is placed atop the first photoresist 20, radiation is provided. Most often the radiation is in the form of ultraviolet light. This radiation exposes the first photoresist 20 at the uncovered areas 28 resulting in making the uncovered areas 28 insoluble. The opposite is true when a negative photoresist is used: the covered areas 26 become insoluble. After exposing the first photoresist 20, the mask 22 is removed. The first photoresist 20 is then developed by washing with a solution which removes the first photoresist 20 in the locations where the first photoresist 20 has not become insoluble. Thus, the photoresist exposure and development leaves a pattern of insoluble material on the top of surface 18 of the substrate 10. This pattern of insoluble material mirrors the pattern 24 of the mask 22.

Figure 17:
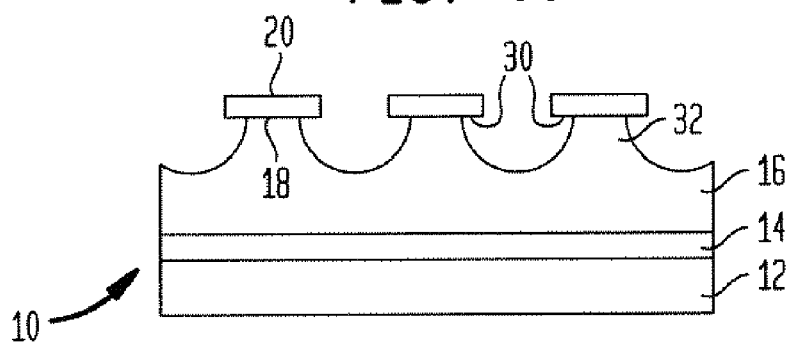
FIG. 17 is a schematic illustration of the substrate of FIG. 14 being etched.

After exposure and development of the photoresist, the substrate is etched as shown in FIG. 17. Once a certain depth of etching is reached, the etching process is interrupted. For example, the etching process can be terminated after a predetermined time. The etching process leaves first microcontact portions 32 projecting upwardly from substrate 10 at the thick layer 16. As the etchant attacks the thick layer 16, it removes material beneath the edges of first photoresist 20 allowing the first photoresist 20 to project laterally from the top of first microcontact portions 32, denoted as overhang 30. The first photoresist 20 remains at particular locations as determined by the mask 22.

Figure 18:
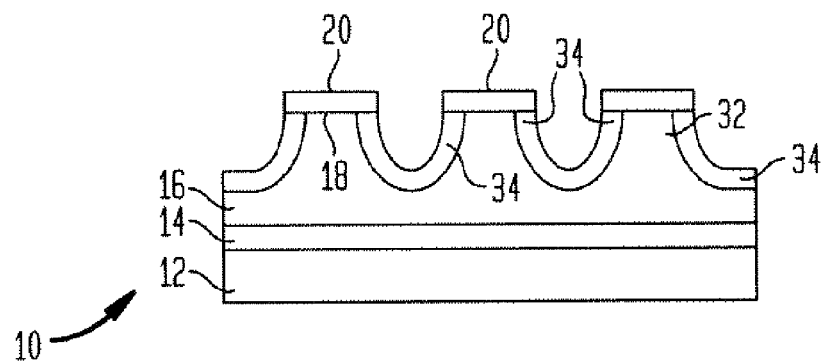
FIG. 18 is a schematic illustration of the substrate of FIG. 14 with a second photoresist.

Once the thick layer 16 has been etched to a desired depth, a second layer of photoresist 34 (FIG. 18) is deposited on the tri-metal substrate 10. In this instance, the second photoresist 34 is deposited onto the thick layer 16 at the locations where the thick layer 16 has been previously etched. Thus, the second photoresist 34 also covers the first microcontact portions 32. If using electrophoretic photoresists, the second photoresist 34, due to its inherent chemical properties, does not deposit onto the first photoresist 20.

Figure 19:
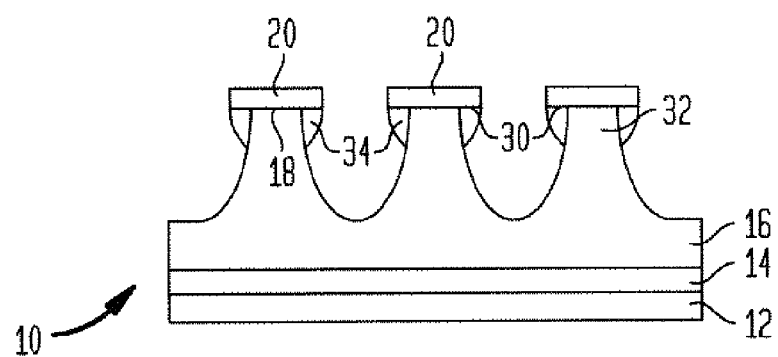
FIG. 19 is a schematic illustration of the substrate of FIG. 14 having the second photoresist developed.

At the next step, the substrate with the first and second photoresists, 20 and 34 is exposed to radiation and then the second photoresist is developed. As shown in FIG. 19, the first photoresist 20 projects laterally over portions of the thick layer 16, denoted by overhang 30. This overhang 30 prevents the second photoresist 34 from being exposed to radiation and thus prevents it from being developed and removed, causing portions of the second photoresist 34 to adhere to the first microcontact portions 32. Thus, the first photoresist 20 acts as a mask to the second photoresist 34. The second photoresist 34 is developed by washing so as to remove the radiation exposed second photoresist 34. This leaves the unexposed portions of second photoresist 34 on the first microcontact portions 32.

Figure 20:
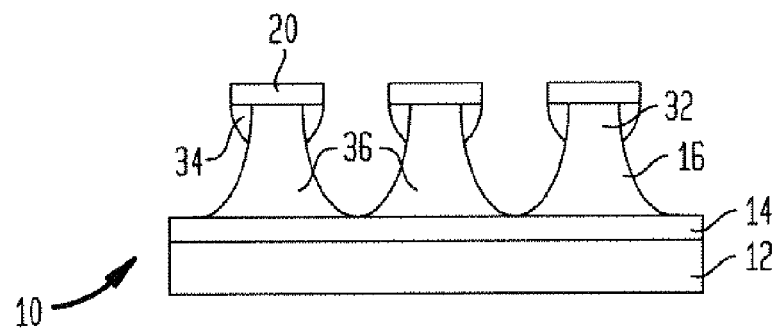
FIG. 20 is a schematic illustration of the substrate of FIG. 14 being etched a second time.

Once portions of the second photoresist 34 have been exposed and developed, a second etching process is performed, removing additional portions of the thick layer 16 of the tri-metal substrate 10, thereby forming second microcontact portions 36 below the first microcontact portions 32 as shown in FIG. 20. During this step, the second photoresist 34, still adhered to first microcontact portions 32, protects the first microcontact portions 32 from being etched again.

These steps may be repeated as many times as desired to create the preferred aspect ratio and pitch forming third, fourth or nth microcontact portions. The process may be stopped when the etch-stop layer 14 is reached. As a final step, the first and second photoresists 20 and 34, respectively, may be stripped entirely.

Figure 21A:
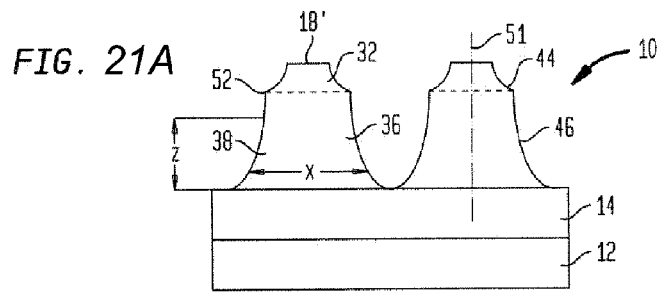
FIGS. 21A-21D are example profiles of microcontacts.
Figure 21B:
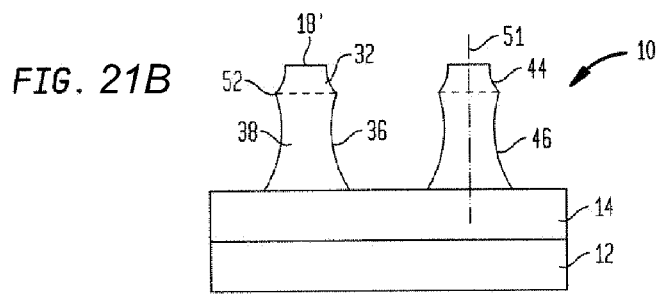
Figure 21C:
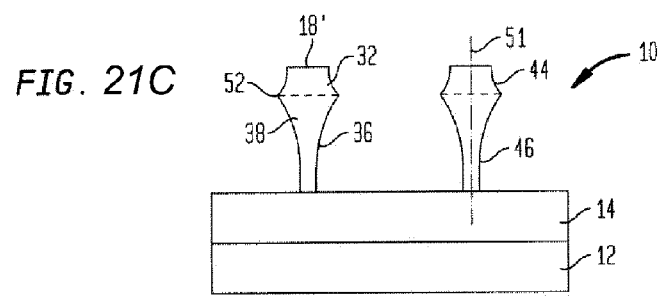

These processes result in microcontacts 38 shown in FIGS. 21A through 21D. These figures also illustrate the various profiles that may be achieved using the processes described herein. Referring to FIGS. 21A-21C, the microcontacts 38 have a first portion 32, also known as a tip region, and a second portion 36, also referred to as the base region. Provided that the spots of first photoresist used in the steps discussed above are circular, each microcontact will be generally in the form of a body of revolution about a central axis 51 (FIG. 21A) extending in a vertical or Z direction, upwardly from the remainder of the substrate and generally perpendicular to the plane of the etch stop layer 14. The widths or diameters X of the first and second portions vary with position in the Z or height direction within each portion. Stated another way, within the first portion, $X=F1(Z)$, and within the second portion $X=F2(Z)$. The slope or $dX/dZ$ may change abruptly at the boundary 52 between the first and second portions. Within each portion, the slope or $dX/dZ$ typically does not change abruptly with position in the Z direction and thus, does not define a step change. Within each portion, typically the slope or $dX/dZ$ changes at most gradually with position in the Z direction.

As further seen in FIG. 21A, the circumferential surface 44 of the first portion 32 of the microcontact region and the circumferential surface 46 of the second portion 38 are concave surfaces, and each has a slope or $dX/dZ$ which changes at most gradually with position in the Z direction. With respect to each of the circumferential surfaces of the microcontacts described herein (e.g., surface 44, or surface (FIG. 21A)), "concave" means that at every height between the boundaries of the circumferential surfaces (e.g., at every height 29 between an upper boundary 19 of the circumferential surface 44 and a lower boundary 52 of that circumferential surface 44 (FIG. 21E)), the circumferential surface encloses a smaller diameter 25 than the diameter, at the same height 29, enclosed by a theoretical conical surface defined by a series of straight lines extending between the boundaries. For example, every point on circumferential surface 44 between boundaries 19, 52 lies inward from the theoretical conical surface 48 defined by a series of straight lines extending through the boundaries 19, 52.

The particular functions and hence the shape of the microcontacts are determined by the etching conditions used in the first and second etching steps. For example, the composition of the etchant and etching temperature can be varied to vary the rate at which the etchant attacks the metal layer. Also, the mechanics of contacting the etchant with the metal layer can be varied. The etchant can be sprayed forcibly toward the substrate, or the substrate can be dipped into the etchant. The etching conditions may be the same or different during etching of the first and second portions.

In the microcontacts shown in FIG. 21A, the circumferential surfaces 44, 46 of each of the first and second portions 32, 36 are concave. In addition, in the embodiment of FIG. 21A, the first portion 32 has a circumferential surface 44 which flares outwardly in the downward direction, so that the magnitude of the slope or dX/dZ increases in the downward direction. The second portion 36 also has a circumferential surface 46 flares outwardly; the magnitude of the slope or dX/dZ of the second is at a minimum at boundary 52, and progressively increases in the direction toward the base of the post. There is a substantial change in slope at boundary 52. The maximum width or diameter X of the second portion, at the base of the microcontact where the microcontact joins layer 14, is substantial greater than the maximum width or diameter of the first portion.

In each of the embodiments seen in FIGS. 21A-21D, the circumferential surface of each portion of each microcontact is concave. These embodiments vary in other ways. For example, in FIG. 21B, the maximum width of second portion 36 is only slightly greater than the maximum width of first portion 32. Also, the second portion has a minimum width at a location between the base of the post and the boundary 52, so that the width gradually decreases in the upward direction to the minimum and then progressively increases in the upward direction from the minimum to the boundary 52. Such a shape is commonly referred to as a "cooling tower" shape. In the microcontacts of FIG. 21B, the slope or dX/dZ changes sign at the boundary 52 between the portions. In FIG. 21C, the second portion 36 has its minimum width near the base of the microcontact.

Figure 21D:
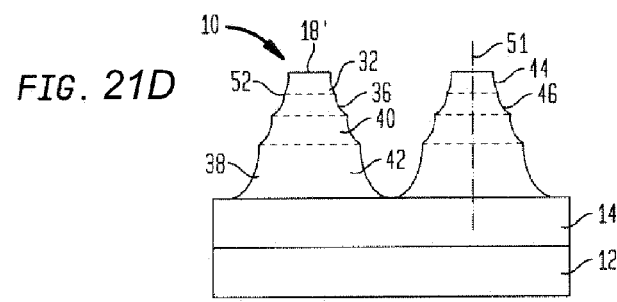
Figure 21E:
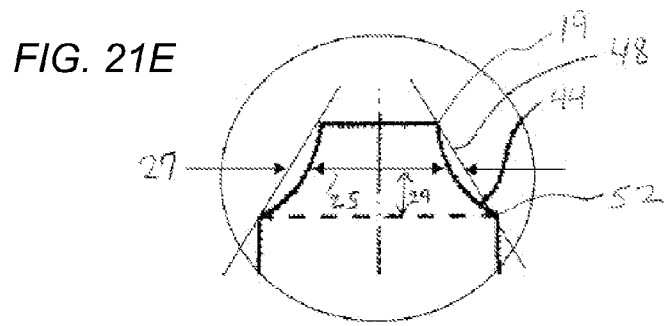
FIG. 21E is an enlarged profile of the tip region of a microcontact shown in FIG. 21B.

Lastly, FIG. 21D illustrates a profile of a microcontact 38 having more than two portions. This type of profile may result in the event the steps of the processes described herein are performed numerous times. Thus, it can be seen that this particular microcontact 38 has four portions, the first and second portions 32 and 36, respectively, and third and fourth portions, 40 and 42, respectively. These four portions may have any dimension and be wider or slimmer than another portion as desired. In this instance, there may be greater than one boundary. FIGS. 21A-21D are only representative profiles and a variety of profiles may be achieved. The first portion 32 can also be referred to as the tip region, the fourth portion 42 can also be referred to as the base region, and the second portion 36 and the third portion 40 can be referred to as intermediate regions.

Figure 27:
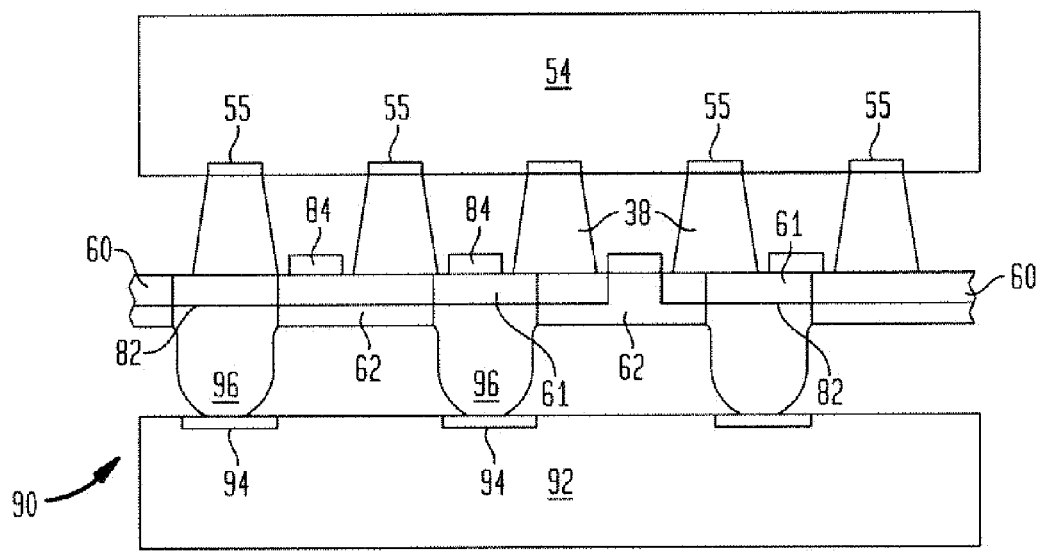
FIG. 27 is a schematic illustration of a microelectronic assembly.

Although arrays including only two microcontacts or posts are depicted in each of FIGS. 21A-21D, in practice, an array of posts including numerous posts can be formed. In the embodiments depicted in each of FIGS. 21A-21D, all of the microcontacts or posts in the array are formed from a single metallic layer 16 (FIG. 27). Each microcontact overlies a portion of the etch stop layer 14 at the base of the microcontact, where the microcontact connects to metallic layer 12. As discussed below, the etch stop layer 14 typically is removed in regions between the microcontact, and metallic layer 12 typically is etched or otherwise treated to convert it into traces or other conductive features connected to the microcontact. However, the body of each microcontact, from its base to its tip, is a unitary body, free of joints such as welds, and having substantially uniform composition throughout. Also, because the tip surfaces 18' of the microcontacts, at the ends of the microcontacts remote from layers 12 and 14, are portions of the original top surface 18 of metal layer 16 (FIG. 14), these tip surfaces are substantially flat and horizontal, and the tip surfaces of all of the microcontacts are substantially coplanar with one another.

In an alternate embodiment, rather than remove the first photoresist 20 only at selected locations after the first etching step, the entire first photoresist 20 may be removed. In this instance, the second photoresist 34 may be deposited over the entire surface of the substrate 10. Then the mask 22 is placed onto the second photoresist 34. The mask 22 must be properly aligned so as to expose only at the locations previously exposed, on the first microcontact portions 32. The second photoresist 34 is then developed and further etching may be performed on the substrate 10.

Figure 22:
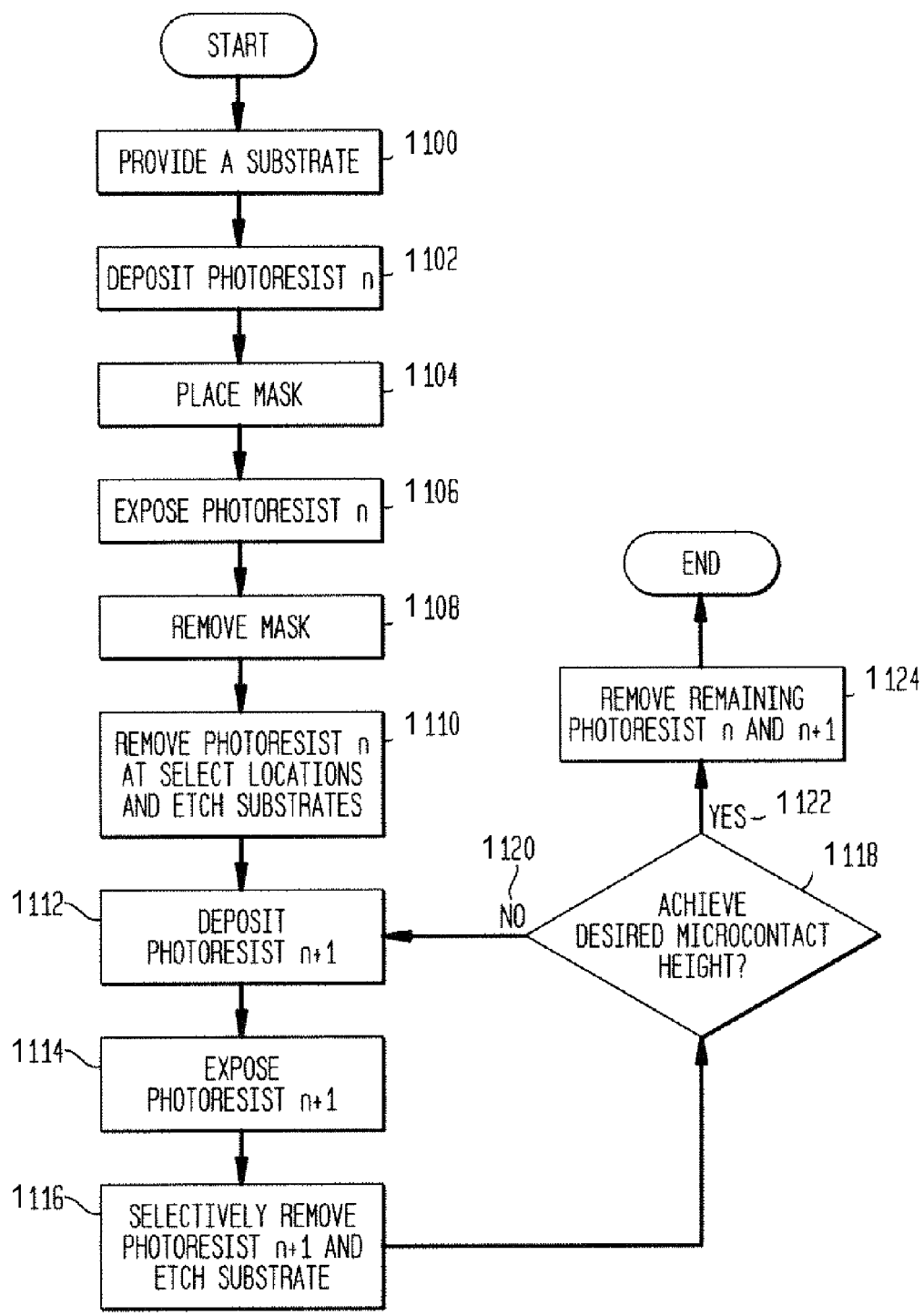
FIG. 22 is a flowchart depicting a first embodiment.

FIG. 22 is a flowchart depicting the first embodiment. Beginning at step 1100, a substrate is provided. Then at step 1102, a photoresist n is deposited onto the substrate. Then at step 1104, a mask is placed atop the photoresist n. At step 1106 the photoresist n is exposed to radiation. Subsequently, at step 1108 the mask is removed and then at step 1110, the photoresist n is developed at select locations and the substrate is etched.

Next, another photoresist is deposited, known as n+1 at step 1112. Then, at step 1114, this n+1 photoresist is exposed to radiation. Subsequently, at step 1116, the photoresist n+1 is removed at select locations and the substrate is etched again. Then, it is evaluated whether the desired microcontact height has been achieved at step 1118. If the desired microcontact height has not been achieved, at step 1120, the process returns to step 1112 and another photoresist is deposited onto the substrate. If the desired height has been achieved at step 1122, then the remaining photoresists are removed at step 1124 and the process ends.

Figure 23:
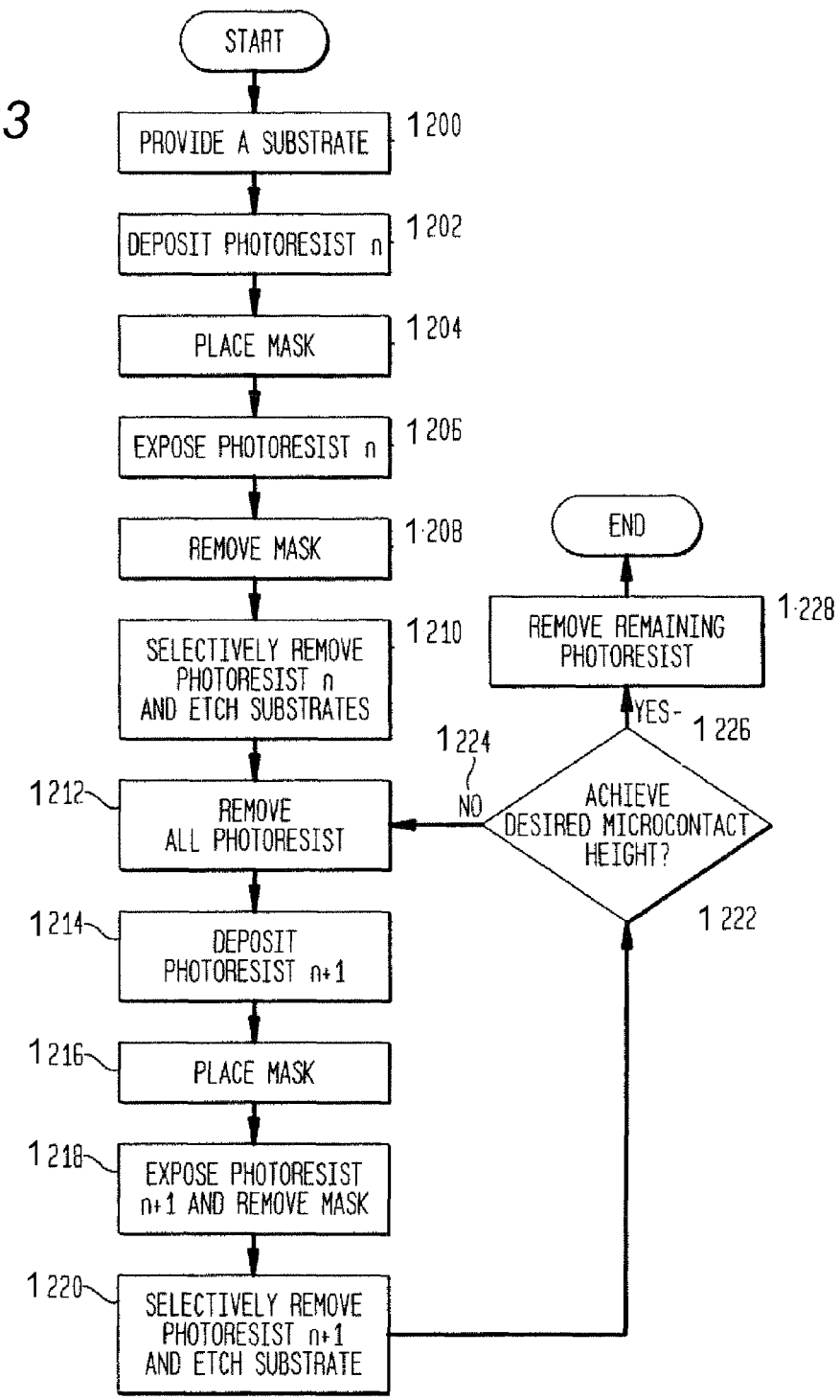
FIG. 23 is a flowchart depicting a second embodiment.

FIG. 23 is a flowchart depicting a second embodiment. Steps 1200-1210 of the second embodiment mirror steps 1100-1110 of the first embodiment. However, at step 1212, the entire photoresist n is removed. Then, at step 1214, another layer of photoresist n+1 is deposited onto the substrate. Next, the mask is placed back onto the substrate at step 1216. During this step, the mask must be aligned such that its pattern is situated in substantially the same location as when the mask was placed on the photoresist n. Subsequently, at step 1218, the photoresist n+1 is exposed to radiation and the mask is removed.

Next, at step 1220, photoresist n+1 is selectively removed and the substrate is etched again. This process may also be repeated until the desired microcontact height is achieved. Thus, at step 1222, it is evaluated whether the desired microcontact height has been achieved. If the preferred height has not been achieved at step 1224, then the process returns to step 1212 where the photoresist is removed entirely and another photoresist n+1 is deposited and the steps continue thereon. However, if the desired height has been achieved at step 1224, the remaining photoresist is removed at step 1228 and the process ends.

The etch-stop layer 14 and the thin layer 12 may be united with a dielectric layer and then thin layer 12 may be etched to form traces so as to provide a component with the microcontacts connected to the traces and with the microcontacts projecting from the dielectric layer. Such a structure can be used, for example, as an element of a semiconductor chip package. For example, U.S. patent application Ser. No. 11/318,822, filed Dec. 27, 2005, the disclosure of which is hereby incorporated by reference herein, may be used.

Figure 24:
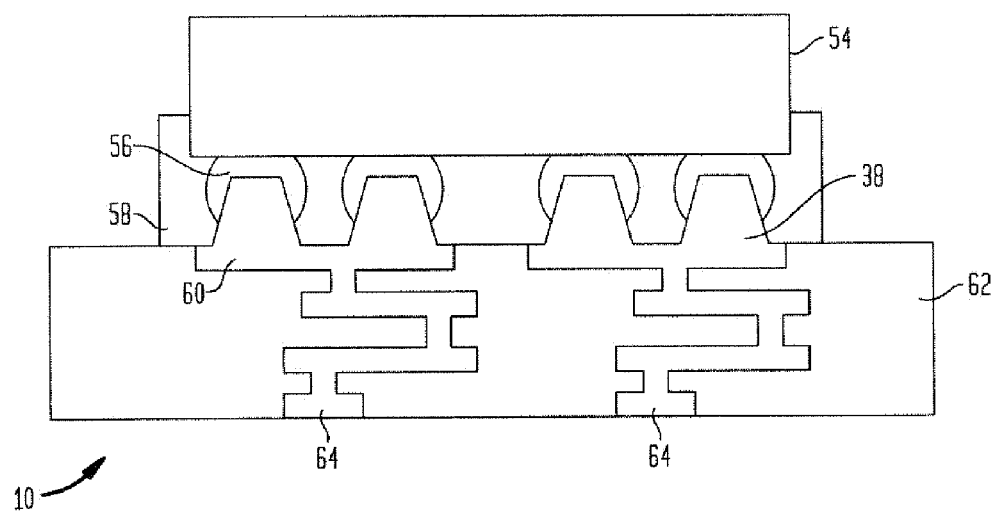
FIG. 24 is a schematic illustration of a multi-layer substrate in application.

The structure described herein may be an integral part of a multilayer substrate 10, for instance, the top layer of a multilayer substrate 10, as shown in FIG. 24. Microcontacts 38 may be soldered to the die 54. The solder 56 may wick around a portion of the microcontacts 38. Wicking provides very good contact between the microcontacts 38 and the die 54. Other bonding processes besides solder 56 may also be used. Surrounding the microcontacts 38 is underfill 58, used to adhere the die 54 to the microcontacts 38 and the substrate 10. Any type of underfill 58 may be used as desired or underfill 58 may be omitted. Below the microcontacts 38 are traces 60 and a dielectric layer 62. Terminals 64 are disposed at the bottom of the substrate 10.

Certain packages include microelectronic chips that are stacked. This allows the package to occupy a surface area on a substrate that is less than the total surface area of the chips in the stack. Packages which include microcontacts fabricated using the processes recited herein may be stacked. Reference is made to U.S. patent application Ser. No. 11/140,312, filed May 27, 2005; and U.S. Pat. No. 6,782,610, the disclosures of which are hereby incorporated by reference. The microcontact etching steps taught in these disclosures may be replaced by the processes discussed herein.

Although a tri-metal substrate is discussed above, a suitable substrate having any number of layers may be utilized, such as for example a single metal. Additionally, rather than use a photoresist, an etch-resistant metal such as gold or other metal substantially resistant to the etchant used to etch the thick metallic layer, may be used. For example, the etch-resistant metal can be used in place of the first photoresist 20 discussed above. Spots of etch-resistant metal may be plated onto the top of the thick layer 16 after applying a mask such as a photoresist with holes at the desired locations for the spots. After plating the etch-resistant metal onto the top of the thick layer, the thick layer is etched to form the microcontacts as discussed above. The etch-resistant metal may be left in place on the tip of the microcontact. In the event an etch-resistant metal is used, as a second etch-resistant material (in place of second photoresist 34 discussed above), a mask may be used to limit deposition of the second etch-resistant metal to only the first portions 32 of the microcontacts, so that the areas between the microcontacts remain free of the etch-resistant metal. Alternately, the entire first layer of etch-resistant metal may be removed upon etching first microcontact portions 32, then a second layer of etch-resistant metal may be deposited to protect the first microcontact portions 32.

Figure 25:
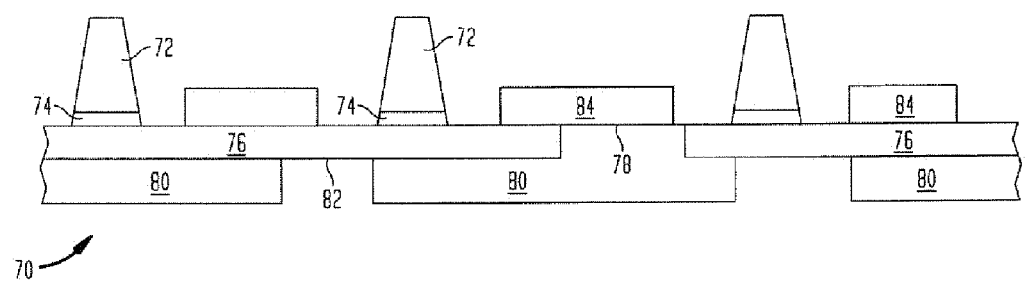
FIG. 25 is a schematic illustration of microelectronic unit.

With reference to FIG. 25, a microelectronic unit 70 is shown having microcontacts 72. The microcontacts 72 have an etch stop layer 74. The microcontacts 72 project vertically from a metallic layer that has been formed into traces 76. There may be gaps or spaces 78 between the traces 76. A first layer of dielectric 80 may be adhered to a bottom side of the unit 70 adjacent the traces 76. Openings 82 in the first layer of dielectric 80 allow the traces 76 to form electronic contacts. A second layer of a dielectric 84 may be formed on a top side of the unit 70.

Figure 26:
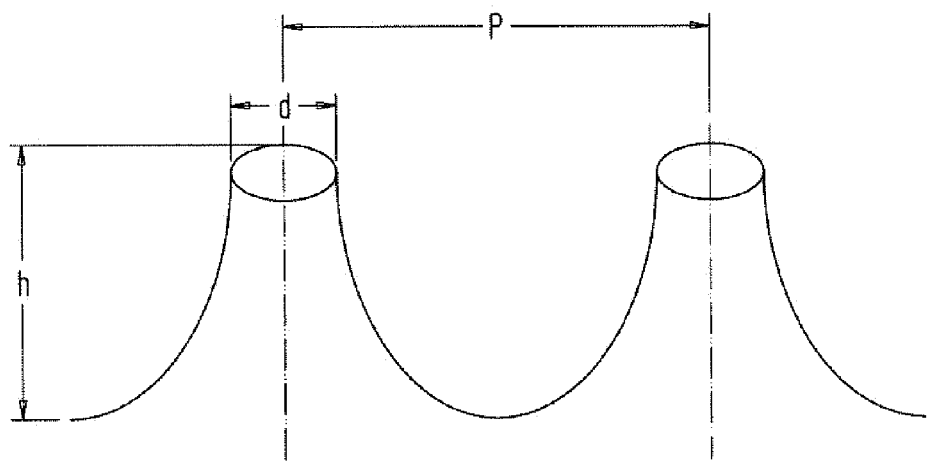
FIG. 26 is a schematic illustration of two adjacent microelectronic units.

The microcontacts formed from these processes may have a typical height ranging from about 40 microns to about 200 microns. Further, the typical pitch between microcontacts may be less than about 200 microns, preferably less than 150 microns. In particular, in reference to FIG. 26, two microcontacts are shown having a tip diameter d and a microcontact height h. A pitch P is defined by the distance between the longitudinal axes of the two microcontacts.

In many applications, particularly where microcontacts are used connected to contacts of a semiconductor chip as, for example, in a structure as discussed below with reference to FIG. 27, it is desirable to provide a small pitch. However, in a process where the microcontacts are formed from a single metal layer by a single etching process, it is normally not practical to make the pitch P less than a certain minimum pitch P0 which is equal to the sum of the diameter d plus the height h. Thus, P0=d+h. In theory, the minimum pitch could be reduced by reducing the tip diameter d. However, it is impossible to make the tip diameter less than zero. Moreover, in many cases it is undesirable to reduce the tip diameter below about 20 or 30 microns. For example, the adhesion between the tips of the pins and spots of photoresist used to protect the tips during etching is proportional to the area of the tips, and hence to the square of the tip diameter. Therefore, with very small tip diameters, the photoresist spots can be dislodged during processing. Thus, using conventional processes, it has been difficult to form microcontacts with very small pitch.

However, the pitch between microcontacts using the process recited herein can be less than Po, (P<Po), for example, P=(0.9)P0 or less. For instance, if the diameter d of the tip is 30 microns and the height h is 60 microns, a conventional process would achieve a pitch Po of 90 microns. However, the process described herein, with at least two etches, can achieve a pitch P of about 80 microns or less. Stated another way, the multi-step etching process allows formation of unitary metallic microcontacts or posts from a single metallic layer with combinations of pitch, tip diameter and height not attainable in conventional etching processes. As the number of etching steps increases, the minimum attainable pitch for a given tip diameter and height decreases.

Referring now to FIG. 27, a microelectronic package 90 is shown using a package element or chip carrier having microcontacts 38 as discussed above. The chip carrier includes a first dielectric layer 62 which may be formed from a material such as polyimide, BT resin or other dielectric material of the type commonly used for chip carriers. The chip carrier also includes traces 60 connected to some or all of the microcontacts 38. The traces incorporate terminals 61. The microcontacts 38 project from a first side of dielectric layer 62, facing upwardly as seen in FIG. 27. Dielectric layer 62 has openings 82, and terminals 61 are exposed at the second or downwardly facing surface of the first dielectric layer 62 through openings 82. The carrier further includes an optional second dielectric layer 84.

The tips of microcontacts 38 are bonded to contacts 55 of a microelectronic element such as a semiconductor chip or die 54. For example, the tips of the microcontacts may be solder-bonded to the contacts 55 of the microelectronic element. Other bonding processes, such as eutectic bonding or diffusion bonding, may be employed. The resulting packaged microelectronic element has some or all of contacts 55 on the microelectronic element connected to terminals 61 by the microcontacts and traces. The packaged microelectronic element may be mounted to a circuit panel 92, such as a printed circuit board by bonding terminals 61 to pads 94 on the circuit board. For instance, pads 94 on the circuit panel 92 may be soldered to the terminals 61, at openings 82, using solder balls 96.

The connection between the microcontacts 38 and the contacts 55 of the microelectronic element can provide a reliable connection even where the contacts 55 are closely spaced. As discussed above, the microcontacts 38 can be formed with reasonable tip diameters and height. The appreciable tip diameter can provide substantial bond area between the tip of each microcontact and the contact of the microelectronic element. In service, differential thermal expansion and contraction of the chip 54 relative to the circuit panel 92 can be accommodated by bending and tilting of microcontacts 38. This action is enhanced by the height of the microcontacts. Moreover, because the microcontacts are formed from a common metal layer, the heights of the microcontacts are uniform to within a very close tolerance. This facilitates engagement and formation of robust bonds between the microcontact tips with the contacts of the chip or other microelectronic element.

The structure of the chip carrier can be varied. For example, the chip carrier may include only one dielectric layer. The traces may be disposed on either side of the dielectric layer. Alternatively, the chip carrier may include a multi-layer dielectric, and may include multiple layers of traces, as well as other features such as electrically conductive ground planes.

A process for further embodiment of the invention uses a structure having post portions 1550 (FIG. 28) projecting from a surface 1526 such as a surface of dielectric layer 1510. Post portions 1550 may be formed by any process, but desirably are formed by an etching process similar to those discussed above. After formation of portions 1550, a metallic or other conductive layer 1502 is applied over the tips 1533 of post portions 1550. For example, layer 1502 may be laminated on the structure incorporating portions 1550, and metallurgically bonded to the tips of post portions 1550. Layer 1502 is selectively treated so as to remove material of the layer remote from post portions 1550, but leave at least part of the layer thickness overlying post portions 1550, and thereby form additional post portions 1504 (FIG. 29) aligned with post portions 1550, and thus form composite microcontacts, each including a proximal post portion 1550 close to the substrate and a distal post portion 1504 remote from the substrate, the distal portion projecting in the vertical or z direction from the proximal portion. The treatment applied to layer 1502 may include an etching process as discussed above, using spots of an etch-resistant material 1506 aligned with post portions 1550. A protective layer such as a dielectric encapsulant 1508 may be applied to cover post portions 1550 before etching layer 1502. Alternatively or additionally, post portions 1550 may be plated or otherwise covered with an etch-resistant conductive material such as nickel or gold before etching layer 1502.

The process of building up successive post portions may be repeated so as to form additional portions on portions 1504, so that microcontacts of essentially any length can be formed. The long microcontacts provide increased flexibility and movement of the post tips. Where one or more dielectric encapsulant layers are left in place around the already-formed post portions, such as layer 1508 in FIGS. 28 and 29, the encapsulant desirably is compliant so that it does not substantially limit flexure of the posts. In other embodiments, the encapsulant is removed before the components are used. Although the microcontacts are illustrated in conjunction with a dielectric substrate 1522 and traces 1528 similar to those discussed above, this process can be used to fabricate microcontacts on essentially any structure.

Figure 29:
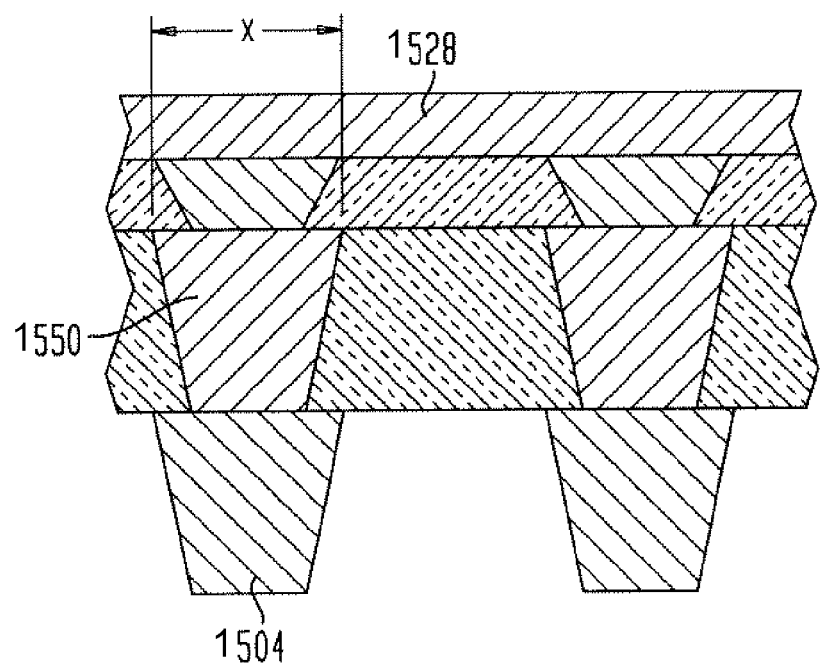
FIG. 29 is yet another schematic illustration of a microelectronic assembly.

As shown in FIG. 29, each microcontact has a horizontal or width dimension x which varies over the vertical or z-direction extent of the proximal post portion 1550 and which increases abruptly, in substantially stepwise fashion, at the juncture between the proximal post portion 1550 and the distal portion 1504, and varies along the vertical extent of the distal portion. The slope of the variation in width with vertical location also changes abruptly at the juncture between the post portions. The pattern of variation of the horizontal or width dimension within each post portion depends upon the process used for etching or otherwise forming such post portion. For example, in a further embodiment, the distal post portions 1504 may be formed by a multi-stage etching process as discussed above, so that each distal post portion includes different sub-portions with different functions defining the variation of width x in the vertical or z direction.

Reference is also made to the following, which are hereby incorporated by reference: U.S. patent application Ser. No. 10/985,126, filed Nov. 10, 2004; Ser. No. 11/318,822, filed Dec. 27, 2005; Ser. No. 11/318,164, filed Dec. 23, 2005; Ser. No. 11/166,982, filed Jun. 24, 2005; Ser. No. 11/140,312, filed May 27, 2005; and U.S. Pat. No. 7,176,043.

Processes for forming posts such as used herein can be as described in U.S. patent application Ser. No. 11/717,587, which is incorporated by reference herein.

Figure 30:
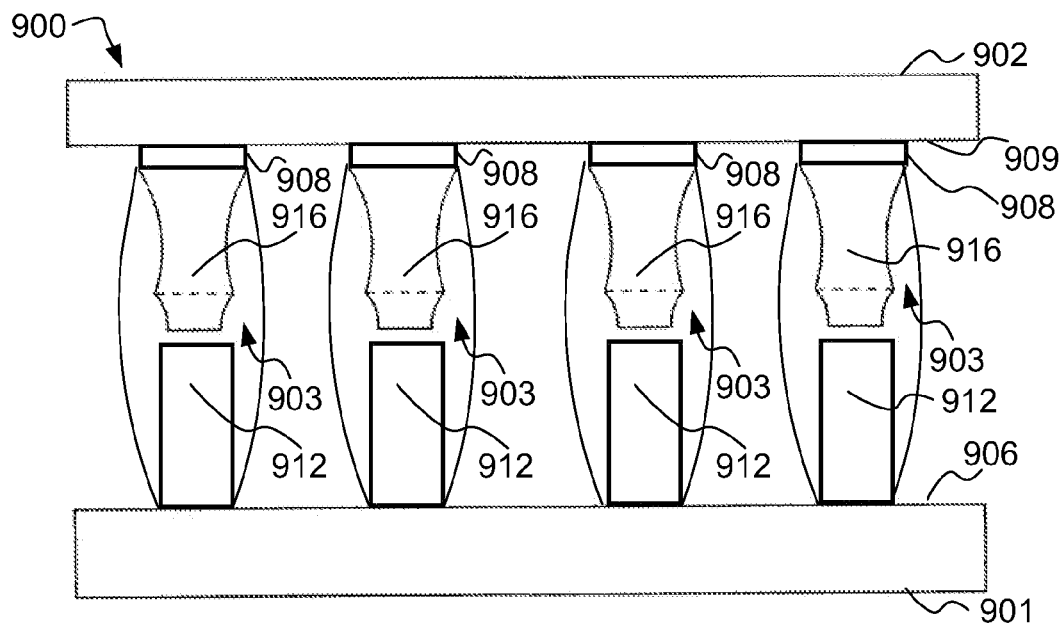
FIG. 30 is a sectional view illustrating a completed microelectronic assembly in accordance with another embodiment.

Reference is now made to FIG. 30, which illustrates a cross-sectional view of a packaged microelectronic assembly 900 in accordance with a variation of the assembly shown and described above with respect to FIGS. 1A-2A, in which posts 916 extending from a front surface of the microelectronic element 902 include multiple-etched conductive posts.

As shown, in this variation, the packaged microelectronic assembly 900 includes a substrate 901 such as that shown and described above with respect to FIG. 1A. The assembly also includes a microelectronic element 902 in a face down or flip-chip position and conductive columns 903 joining the substrate with the microelectronic element. The conductive columns 903 include conductive bumps or posts 912 that protrude above a top surface 906 of the substrate 901 that are aligned with conductive bumps or posts 916 protruding above a front surface 909 of the microelectronic element 902.

The microelectronic element 902 has a front surface 909. The microelectronic element 902 preferably is a semiconductor chip or the like. For example, the microelectronic element may be a bare die. The posts 916 may extend from bond pads 908 exposed at the front surface 909 of the microelectronic element 902.

As shown in FIG. 30, the conductive columns 903 include solder conductively interconnecting the conductive posts 912 and 916, thereby creating the conductive columns 903 that extend from the microelectronic element 902 to the substrate 901. The conductive columns 903 may be bonded together by any process, material, or combination of materials disclosed herein with reference to other embodiments. For example, the conductive columns 903 may be bonded together by eutectic bonding or anodic bonding between the posts and the material of the cover.

The posts 912 may be any type of conductive posts, including any type of conductive posts disclosed herein with reference to other embodiments. For example, the posts 912 may have any shape, including frustoconical. The base and tip of each of the conductive posts 912 may be substantially circular or have a different shape, e.g., oblong.

More specifically, the posts 912 extending from the substrate 901 may be the posts 108 shown in FIGS. 1A, 1C, 2, and 2A, such that the posts 916 extending from the microelectronic element 902 may replace the corresponding posts 110, each of which may include a cap of solder 130.

Prior to joining the posts 912 to the posts 916, the posts 912 may be the posts 208 shown in FIG. 5 and each including a cap of solder 230, such that the posts 916 may replace the corresponding posts 210. The posts 912 may be the posts 308 shown in FIG. 6 and each including a cap of solder 330, such that the posts 916 may replace the corresponding posts 310, each of which may also include a cap of solder 330.

In a particular embodiment, the posts 912 may be the posts 508 shown in FIG. 8, such that the posts 916 may replace the corresponding posts 510. In such an embodiment, the posts 912 and 916 preferably are made from a malleable material with minimal resistance or spring-back as, for example, substantially pure gold, and each post is configured to be deformed into engagement with a corresponding post without the use of solder.

The posts 912 may be the posts 608 shown in FIGS. 9-11, such that the posts 916 may replace the corresponding posts 610. In such an embodiment, the posts 912 and 916 preferably are comprised of copper, and each post is configured to be fused directly to a corresponding post without the presence of a low melting temperature metal such as a solder or tin between the conductive posts.

The posts 912 may be the posts 708 of the multilayer substrate 702 shown in FIG. 12, such that the posts 916 may replace the corresponding posts 710. In such an embodiment, the posts 912 can be joined directly to the posts 916 extending from the microelectric element 902, such as through a diffusion bond formed between a finished metal at the tips of the posts, e.g., gold, and another metal present in the conductive pads and the posts. Alternatively, the posts 912 and 916 can be joined together through a fusible metal such as a solder, tin or a eutectic composition, the fusible metal wetting the posts and the pads to form wetted or soldered joints.

The posts 912 may be the posts 812 and the other posts extending from the substrates 806, 806' shown in FIG. 13, such that the posts 916 may replace the corresponding posts 810, 810'. In such an embodiment, the posts 912 and 916 may be used in a stacked package assembly such as the assemblies 800, 800' shown in FIG. 13.

The posts 912 and 916 may be used with a multilayer substrate, such as the multilayer substrate 10 shown in FIG. 24. The posts 912 may be the microcontacts 38 shown in FIG. 24, and the posts 916 may extend from a microelectronic element or other component such as the die 54, such that the posts 912 may be bonded to the posts 916 using solder or other post bonding processes described herein.

The posts 912 may be the microcontacts 72 shown in FIG. 25, where the posts 912 project vertically from a metallic layer that has been formed into traces 76.

The posts 912 may be the microcontacts 38 shown in FIG. 27, where the posts 912 extend from a substrate that includes traces 60, openings 82, terminals 61, and an optional second dielectric layer 84.

The posts 916 are multiple-etched conductive posts. As shown in FIG. 30, the posts 916 are the same as the dual-etched microcontacts 38 shown in FIG. 21B. As described above with reference to FIG. 21B, each post 916 will be generally in the form of a body of revolution about a central axis extending in a vertical or Z direction, downwardly from the microelectronic element 902 and generally perpendicular to the plane of the front surface 909.

In other embodiments (not shown), the posts 916 may be any multiple-etched conductive posts, including for example, the multiple-etched microcontacts 38 shown in FIGS. 21A, 21C, and 21D. Although the posts 916 are shown as being dual-etched in FIG. 30, the posts 916 may undergo more than two etchings, such as four etchings as shown in FIG. 21D.

Figure 28:
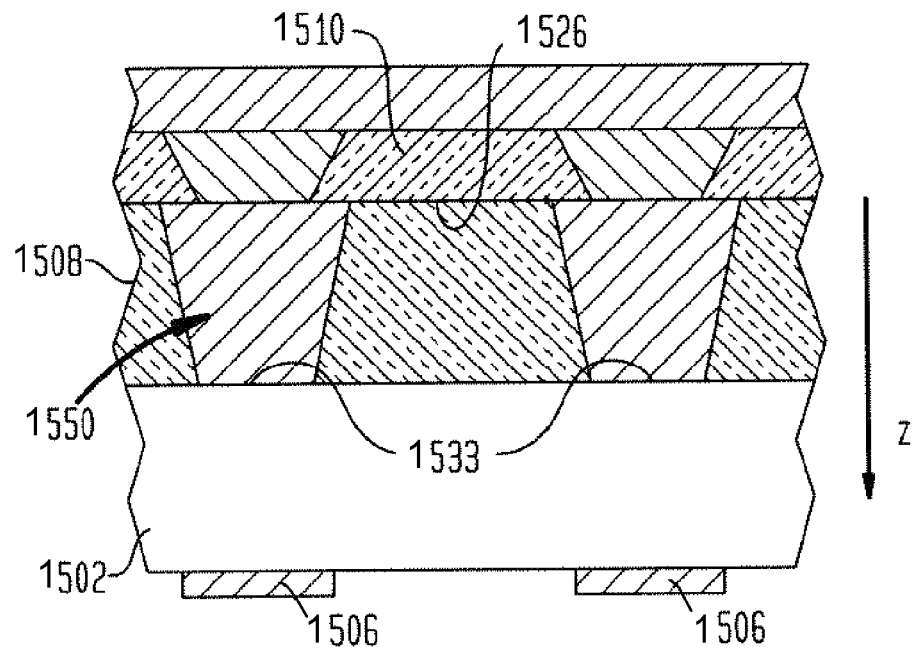
FIG. 28 is another schematic illustration of a microelectronic assembly.

The posts 916 may be composite microcontacts having the structure shown in FIGS. 28 and 29, in which each post 916 includes a proximal post portion 1550 close to the microelectronic element 902 and a distal post portion 1504 remote from the microelectronic element.

Figure 31:
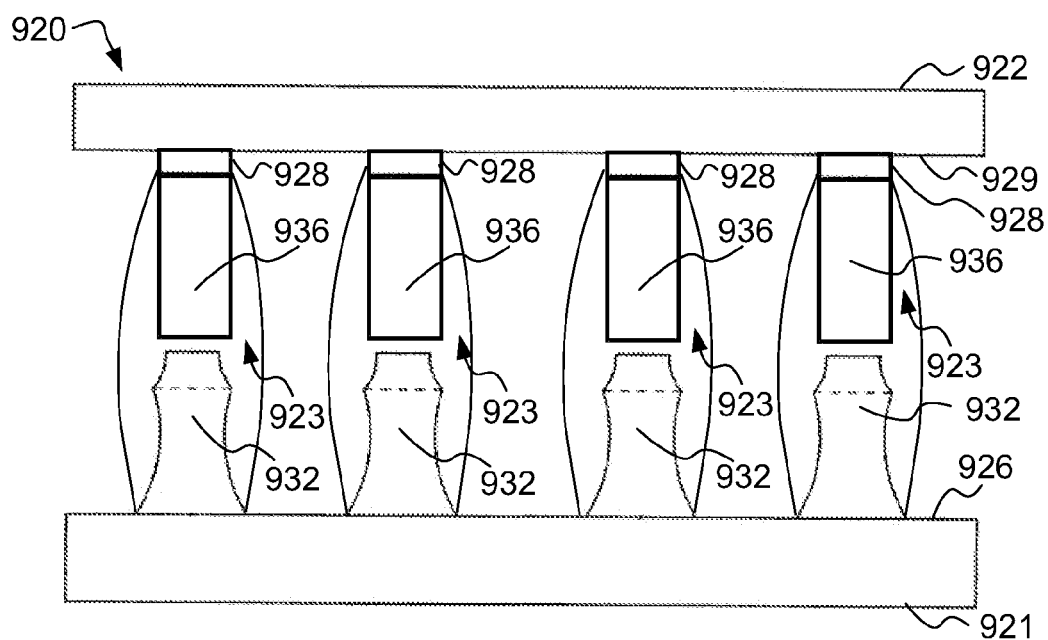
FIG. 31 is a sectional view illustrating a completed microelectronic assembly in accordance with another embodiment.

Reference is now made to FIG. 31, which illustrates a cross-sectional view of a packaged microelectronic assembly 920 in accordance with a variation of the assembly shown and described above with respect to FIGS. 1A-2A, in which posts 932 extending from a top surface of the substrate 921 include multiple-etched conductive posts.

Packaged microelectronic assembly 920 shown in FIG. 31 is substantially the same as packaged microelectronic assembly 900 shown in FIG. 30, except that the posts 932 extending from the substrate 921 are multiple-etched conductive posts, such as the dual-etched microcontacts 38 shown in FIG. 21B, while the posts 936 extending from the microelectronic element 922 may be any type of conductive posts, including any type of conductive posts disclosed herein with reference to other embodiments.

As shown, in this variation, the packaged microelectronic assembly 920 includes a substrate 921 such as that shown and described above with respect to FIG. 1A. The assembly also includes a microelectronic element 922 in a face down or flip-chip position, and conductive columns 923 joining the substrate with the microelectronic element. The conductive columns 923 include conductive bumps or posts 932 that protrude above a top surface 926 of the substrate 921 that are aligned with conductive bumps or posts 936 protruding above a front surface 929 of the microelectronic element 922.

As shown in FIG. 31, the conductive columns 923 include solder conductively interconnecting the conductive posts 932 and 936, thereby creating the conductive columns 923 that extend from the microelectronic element 922 to the substrate 921. The conductive columns 923 may be bonded together by any process, material, or combination of materials disclosed herein with reference to other embodiments.

The posts 932 are multiple-etched conductive posts. As shown in FIG. 31, the posts 932 are the same as the dual-etched microcontacts 38 shown in FIG. 21B. In other embodiments (not shown), the posts 932 may be any multiple-etched conductive posts, including for example, the multiple-etched microcontacts 38 shown in FIGS. 21A, 21C, and 21D. Although the posts 932 are shown as being dual-etched in FIG. 31, the posts 932 may undergo more than two etchings, such as four etchings as shown in FIG. 21D. The posts 932 may be composite microcontacts having the structure shown in FIGS. 28 and 29, in which each post 932 includes a proximal post portion 1550 close to the substrate 922 and a distal post portion 1504 remote from the substrate.

The posts 936 may be any type of conductive posts, including any type of conductive posts disclosed herein with reference to other embodiments. For example, the posts 936 may have any shape, including frustoconical. The base and tip of each of the conductive posts 936 may be substantially circular or have a different shape, e.g., oblong.

More specifically, the posts 936 extending from the microelectronic element 922 may be the posts 110 shown in FIGS. 1B, 2, and 2A, such that the posts 932 extending from the substrate 921 may replace the corresponding posts 108. Each of the posts 936 may include a cap of solder 130.

Prior to joining the posts 936 to the posts 932, the posts 936 may be the posts 210 shown in FIG. 5, such that the posts 932 may replace the corresponding posts 208 that include a cap of solder 230. The posts 936 may be the posts 310 shown in FIG. 6 and each including a cap of solder 330, such that the posts 932 may replace the corresponding posts 308, each of which may also include a cap of solder 330.

In a particular embodiment, the posts 936 may be the posts 510 shown in FIG. 8, such that the posts 932 may replace the corresponding posts 508. In such an embodiment, the posts 932 and 936 preferably are made from a malleable material with minimal resistance or spring-back as, for example, substantially pure gold, and each post is configured to be deformed into engagement with a corresponding post without the use of solder.

The posts 936 may be the posts 610 shown in FIGS. 9-11, such that the posts 932 may replace the corresponding posts 608. In such an embodiment, the posts 932 and 936 preferably are comprised of copper, and each post is configured to be fused directly to a corresponding post without the presence of a low melting temperature metal such as a solder or tin between the conductive posts.

The posts 936 may be the posts 810, 810' shown in FIG. 13, such that the posts 932 may replace the corresponding posts extending from the substrates 806, 806'. In such an embodiment, the posts 932 and 936 may be used in a stacked package assembly such as the assemblies 800, 800' shown in FIG. 13.

The posts 932 and 936 may be used with a multilayer substrate, such as the multilayer substrate 10 shown in FIG. 24. The posts 932 may be the microcontacts 38 shown in FIG. 24, and the posts 936 may extend from a microelectronic element or other component such as the die 54, such that the posts 932 may be bonded to the posts 936 using solder or other post bonding processes described herein.

Figure 32:
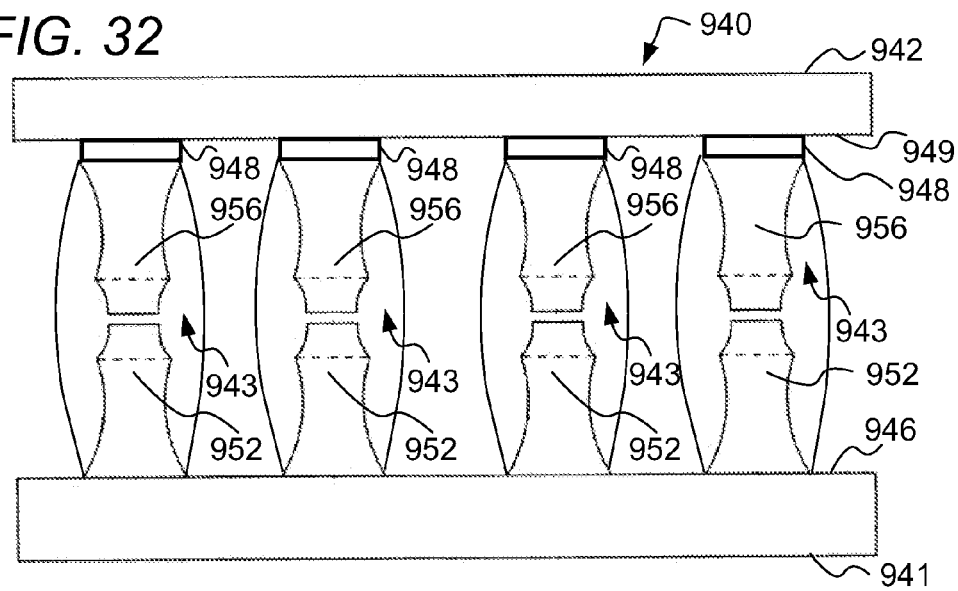
FIG. 32 is a sectional view illustrating a completed microelectronic assembly in accordance with another embodiment.

Reference is now made to FIG. 32, which illustrates a cross-sectional view of a packaged microelectronic assembly 940 in accordance with a variation of the assembly shown and described above with respect to FIGS. 1A-2A, in which posts 952 extending from a top surface of the substrate 941 and posts 956 extending from a front surface of the microelectronic element 942 include multiple-etched conductive posts.

Packaged microelectronic assembly 940 shown in FIG. 32 is substantially the same as packaged microelectronic assembly 900 shown in FIG. 30 and packaged microelectronic assembly 920 shown in FIG. 31, except that both the posts 952 extending from the substrate 941 and the posts 956 extending from the microelectronic element 942 are multiple-etched conductive posts, such as the dual-etched microcontacts 38 shown in FIG. 21B.

As shown, in this variation, the packaged microelectronic assembly 940 includes a substrate 941 such as that shown and described above with respect to FIG. 1A. The assembly also includes a microelectronic element 942 in a face down or flip-chip position, and conductive columns 943 joining the substrate with the microelectronic element. The conductive columns 943 include conductive bumps or posts 952 that protrude above a top surface 946 of the substrate 941 that are aligned with conductive bumps or posts 956 protruding above a front surface 949 of the microelectronic element 942.

As shown in FIG. 32, the conductive columns 943 include solder conductively interconnecting the conductive posts 952 and 956, thereby creating the conductive columns 943 that extend from the microelectronic element 942 to the substrate 941. The conductive columns 943 may be bonded together by any process, material, or combination of materials disclosed herein with reference to other embodiments.

The posts 952 and 956 are multiple-etched conductive posts. As shown in FIG. 32, the posts 952 and 956 are the same as the dual-etched microcontacts 38 shown in FIG. 21B. In other embodiments (not shown), the posts 952 and 956 may be any multiple-etched conductive posts, including for example, the multiple-etched microcontacts 38 shown in FIGS. 21A, 21C, and 21D.

Although the posts 952 and 956 are shown as the same as the dual-etched microcontacts 38 shown in FIG. 21B, in other embodiments (not shown), the posts 952 may have a different multiple-etched shape than the posts 956, including for example, where the posts 952 are shaped as shown in FIG. 21A and the posts 956 are shaped as shown in FIG. 21C, such that first and second functions that determine the shape of the posts 952 and that are determined by the etching conditions used in the first and second etching steps of the posts 952 may be different than third and fourth functions that determine the shape of the posts 956 and that are determined by the etching conditions used in the first and second etching steps of the posts 956.

Although the posts 952 and 956 are shown as being dual-etched in FIG. 32, either or both the posts 952 and 956 may undergo more than two etchings, such as four etchings as shown in FIG. 21D. The posts 952 and 956 may be composite microcontacts having the structure shown in FIGS. 28 and 29, in which each post 952 and 956 includes a proximal post portion 1550 close to the substrate 942 and a distal post portion 1504 remote from the substrate.

More specifically, either or both of the posts 952 and 956 may include a cap of solder, as shown in FIGS. 1B, 1C, 5, and 6.

Similar to the embodiment shown in FIG. 8, the posts 952 and 956 may be made from a malleable material with minimal resistance or spring-back as, for example, substantially pure gold, and each post is configured to be deformed into engagement with a corresponding post without the use of solder.

Similar to the embodiment shown in FIG. 9, the posts 952 and 956 may be comprised of copper, and each post may be configured to be fused directly to a corresponding post without the presence of a low melting temperature metal such as a solder or tin between the conductive posts.

The posts 952 and 956 may be used in a stacked package assembly such as the assemblies 800, 800' shown in FIG. 13. The posts 952 and 956 may be used with a multilayer substrate, such as the multilayer substrate 10 shown in FIG. 24.

Figure 33:
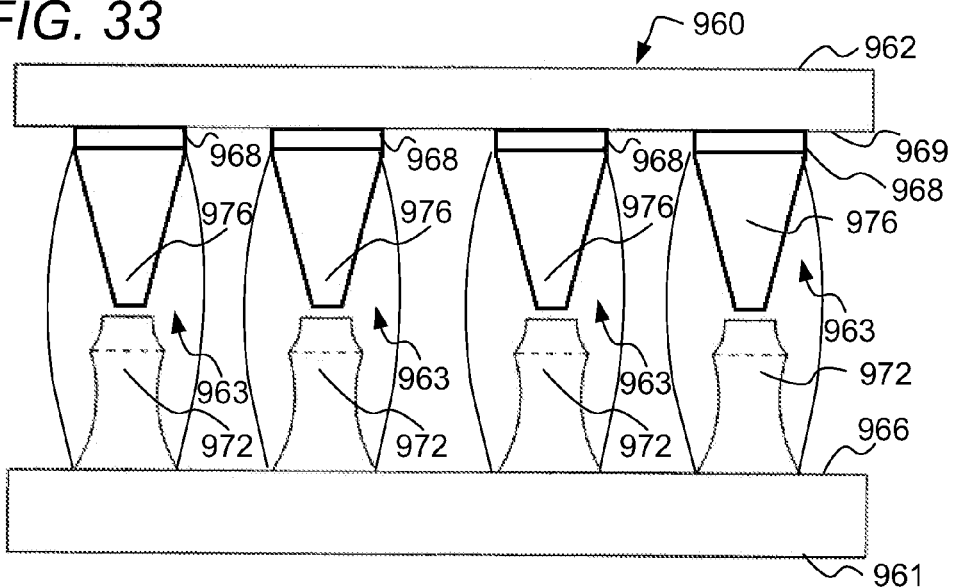
FIG. 33 is a sectional view illustrating a completed microelectronic assembly in accordance with another embodiment.

Reference is now made to FIG. 33, which illustrates a cross-sectional view of a packaged microelectronic assembly 960 in accordance with a variation of the assembly shown and described above with respect to FIGS. 1A-2A, in which posts 972 extending from a top surface of the substrate 961 include multiple-etched conductive posts.

Packaged microelectronic assembly 960 shown in FIG. 33 is substantially the same as packaged microelectronic assembly 920 shown in FIG. 31, except that the posts 976 extending from the microelectronic element 962 have a frustoconical shape, such as any of the frustoconical posts or microcontacts disclosed herein with reference to other embodiments.

As shown, in this variation, the packaged microelectronic assembly 960 includes a substrate 961 such as that shown and described above with respect to FIG. 1A. The assembly also includes a microelectronic element 962 in a face down or flip-chip position, and conductive columns 963 joining the substrate with the microelectronic element. The conductive columns 963 include conductive bumps or posts 972 that protrude above a top surface 966 of the substrate 961 that are aligned with conductive bumps or posts 976 protruding above a front surface 969 of the microelectronic element 962.

As shown in FIG. 33, the conductive columns 963 include solder conductively interconnecting the conductive posts 972 and 976, thereby creating the conductive columns 963 that extend from the microelectronic element 962 to the substrate 961. The conductive columns 963 may be bonded together by any process, material, or combination of materials disclosed herein with reference to other embodiments.

The posts 972 are multiple-etched conductive posts. As shown in FIG. 33, the posts 972 are the same as the dual-etched microcontacts 38 shown in FIG. 21B. In other embodiments (not shown), the posts 972 may be any multiple-etched conductive posts, including for example, the multiple-etched microcontacts 38 shown in FIGS. 21A, 21C, and 21D. Although the posts 972 are shown as being dual-etched in FIG. 33, the posts 972 may undergo more than two etchings, such as four etchings as shown in FIG. 21D. The posts 972 may be composite microcontacts having the structure shown in FIGS. 28 and 29, in which each post 972 includes a proximal post portion 1550 close to the substrate 962 and a distal post portion 1504 remote from the substrate.

More specifically, either or both of the posts 972 and 976 may include a cap of solder, as shown in FIGS. 1B, 1C, 5, and 6.

Similar to the embodiment shown in FIG. 8, the posts 972 and 976 may be made from a malleable material with minimal resistance or spring-back as, for example, substantially pure gold, and each post is configured to be deformed into engagement with a corresponding post without the use of solder.

Similar to the embodiment shown in FIG. 9, the posts 972 and 976 may be comprised of copper, and each post may be configured to be fused directly to a corresponding post without the presence of a low melting temperature metal such as a solder or tin between the conductive posts.

The posts 972 and 976 may be used in a stacked package assembly such as the assemblies 800, 800' shown in FIG. 13. The posts 972 and 976 may be used with a multilayer substrate, such as the multilayer substrate 10 shown in FIG. 24.

Figure 34:
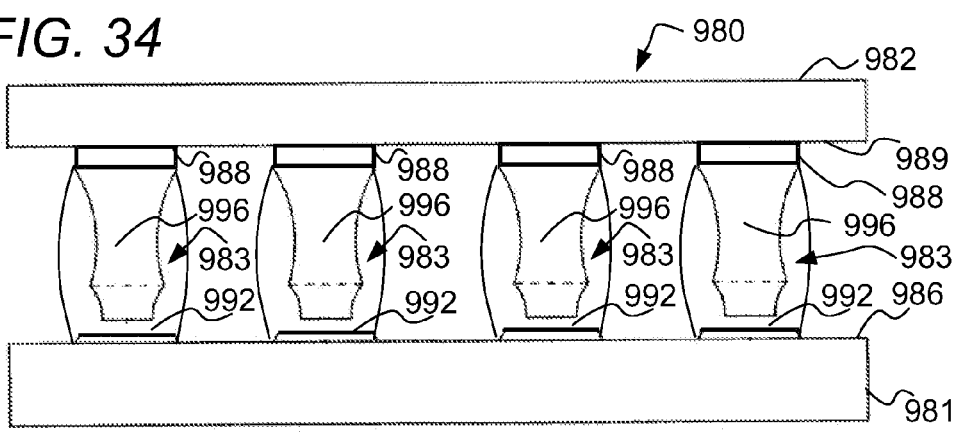
FIG. 34 is a sectional view illustrating a completed microelectronic assembly in accordance with another embodiment.

Reference is now made to FIG. 34, which illustrates a cross-sectional view of a packaged microelectronic assembly 980 in accordance with a variation of the assembly shown and described above with respect to FIGS. 1A-2A, in which posts 996 extending from a front surface of the microelectronic element 982 include multiple-etched conductive posts.

Packaged microelectronic assembly 980 shown in FIG. 33 is substantially the same as packaged microelectronic assembly 900 shown in FIG. 30, except that the posts 912 extending from the substrate 901 in FIG. 30 have been replaced with bond pads 992 attached to the substrate 981, such as any of the bond pads disclosed herein with reference to other embodiments.

As shown, in this variation, the packaged microelectronic assembly 980 includes a substrate 981 such as that shown and described above with respect to FIG. 1A. The assembly also includes a microelectronic element 982 in a face down or flip-chip position, and conductive columns 983 joining the substrate with the microelectronic element. The conductive columns 983 include conductive bond pads 992 that are attached to a top surface 986 of the substrate 981 that are aligned with conductive bumps or posts 996 protruding above a front surface 989 of the microelectronic element 982.

As shown in FIG. 34, the conductive columns 983 include solder conductively interconnecting the conductive posts 996 and pads 992, thereby creating the conductive columns 983 that extend from the microelectronic element 982 to the substrate 981. The conductive columns 983 may be bonded together by any process, material, or combination of materials disclosed herein with reference to other embodiments.

The posts 996 are multiple-etched conductive posts. As shown in FIG. 34, the posts 996 are the same as the dual-etched microcontacts 38 shown in FIG. 21B. In other embodiments (not shown), the posts 996 may be any multiple-etched conductive posts, including for example, the multiple-etched microcontacts 38 shown in FIGS. 21A, 21C, and 21D. Although the posts 996 are shown as being dual-etched in FIG. 33, the posts 996 may undergo more than two etchings, such as four etchings as shown in FIG. 21D. The posts 996 may be composite microcontacts having the structure shown in FIGS. 28 and 29, in which each posts 996 includes a proximal post portion 1550 close to the microelectronic element 981 and a distal post portion 1504 remote from the microelectronic element.

More specifically, either or both of the pads 992 and posts 996 may include a cap of solder, as shown in FIGS. 1B, 1C, 5, and 6.

Similar to the embodiment shown in FIG. 8, the pads 992 and posts 996 may be made from a malleable material with minimal resistance or spring-back as, for example, substantially pure gold, and each post is configured to be deformed into engagement with a corresponding post without the use of solder.

Similar to the embodiment shown in FIG. 9, the pads 992 and posts 996 may be comprised of copper, and each post may be configured to be fused directly to a corresponding post without the presence of a low melting temperature metal such as a solder or tin between the conductive posts.

The pads 992 and posts 996 may be used in a stacked package assembly such as the assemblies 800, 800' shown in FIG. 13. The pads 992 and posts 996 may be used with a multilayer substrate, such as the multilayer substrate 10 shown in FIG. 24.

Figure 35:
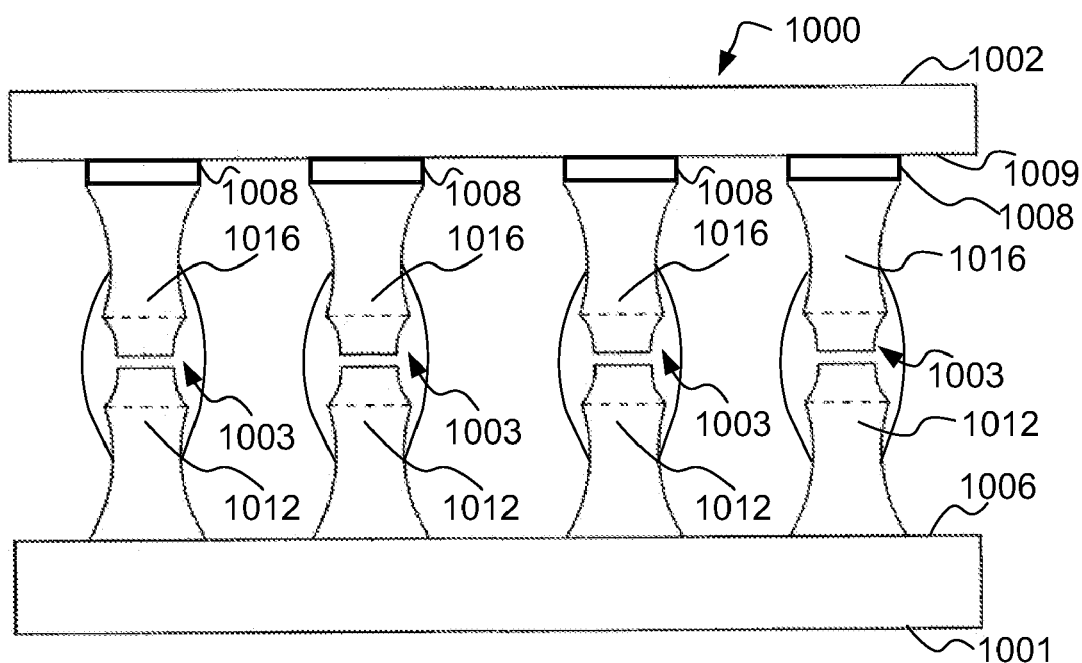
FIG. 35 is a sectional view illustrating a completed microelectronic assembly in accordance with another embodiment.

Reference is now made to FIG. 35, which illustrates a cross-sectional view of a packaged microelectronic assembly 1000 in accordance with a variation of the assembly shown and described above with respect to FIGS. 1A-2A, in which posts 1012 extending from a top surface of the substrate 1001 and posts 1016 extending from a front surface of the microelectronic element 1002 include multiple-etched conductive posts.

Packaged microelectronic assembly 1000 shown in FIG. 35 is substantially the same as packaged microelectronic assembly 940 shown in FIG. 32, except that the solder included in the conductive columns 1003 that conductively interconnect the conductive posts 1012 and 1016 does not touch the conductive pads 1008 of the microelectronic element 1002. In a particular embodiment, the solder included in the conductive columns 1003 does not touch the surface 1006 of the substrate 1001 or does not touch the pads (not shown) from which posts 1012 of the substrate can extend, such pads which may be exposed at a surface 1006 of the substrate.

The conductive columns 903, 923, 943, 963, and 983 shown in FIGS. 30-34 provide for increased height for chip-on-substrate packaging by increasing the standoff or vertical distance between the microelectronic element and the substrate, while at the same time allowing for a decrease in the center-to-center horizontal distance or pitch between the conductive columns. The ability to increase the distance between the substrate and the microelectronic element may help reduce stress at the conductive columns, may help ease the application of underfill (see, for example, FIG. 2A), and allow for a greater variety of underfills to be used.

The posts 912 and 916 shown in FIG. 30, the posts 932 and 936 shown in FIG. 31, the posts 952 and 956 shown in FIG. 32, the posts 972 and 976 shown in FIG. 33, and the bond pads 992 and the posts 996 shown in FIG. 34 may be made from any electrically conductive material, such as copper, copper alloys, gold and combinations thereof. The posts 932 and 936 shown in FIG. 31, the posts 952 and 956 shown in FIG. 32, the posts 972 and 976 shown in FIG. 33, and the bond pads 992 and the posts 996 shown in FIG. 34 may include an exposed metal layer that is wettable by solder. For example, the posts may be comprised of copper with a layer of gold at the surfaces of the posts. Additionally, the posts 932 and 936 shown in FIG. 31, the posts 952 and 956 shown in FIG. 32, the posts 972 and 976 shown in FIG. 33, and the bond pads 992 and the posts 996 shown in FIG. 34 may include at least one layer of metal having a melting temperature that is greater than a melting temperature of the solder to which it will be joined. For example, such conductive posts would include a layer of copper or be formed entirely of copper.

The dimensions of the posts 932 and 936 shown in FIG. 31, the posts 952 and 956 shown in FIG. 32, the posts 972 and 976 shown in FIG. 33, and the posts 996 shown in FIG. 34 can vary over a significant range, but most typically the height of each post extending from the front surfaces of the substrate and the microelectronic element is at least 30 microns and can extend up to 300 microns. These posts may have a height (approximately perpendicular to the front surfaces of the substrate and the microelectronic element, respectively) that is greater than its diameter or width (approximately parallel to the front surfaces of the substrate and the microelectronic element, respectively). However, the height may also be smaller than the width, such as at least half the size of the width.

Processes for electrically connecting a microelectronic element such as a semiconductor chip to a substrate, e.g., chip carrier, can be as further described in U.S. patent application Ser. No. 12/286,102, which is incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A packaged microelectronic element, comprising:
a microelectronic element having a front surface and a plurality of solid metal posts extending away from the front surface; and
a substrate having a major surface and a plurality of conductive elements exposed at the major surface, the conductive elements being joined to the solid metal posts;
each solid metal post including a base region adjacent the microelectronic element and a tip region, remote from the microelectronic element, the base region and tip region having respective concave circumferential surfaces;
each solid metal post having a horizontal dimension which is a first function of vertical location in the base region and which is a second function of vertical location in the tip region.

2. The packaged microelectronic element of claim 1, wherein each solid metal post further includes at least one intermediate region located between the base region and the top region, the intermediate region having a concave circumferential surface, the horizontal dimension of each solid metal post being a third function of vertical location in the intermediate region.

3. The packaged microelectronic element of claim 1, wherein each solid metal post has a width in a direction of the front surface and a height extending from the front surface, wherein the height is at least half of the width.

4. The packaged microelectronic element of claim 1, wherein the solid metal posts are joined to the conductive elements with a fusible metal.

5. The packaged microelectronic element of claim 4, wherein the fusible metal comprises solder, and the solder covers at least portions of edge surfaces of each solid metal post.

6. The packaged microelectronic element of claim 5, further comprising a plurality of conductive pads located at the front surface, wherein each solid metal post extends from a respective one of the plurality of conductive pads and the solder does not touch at least one of the plurality of conductive pads.

7. The packaged microelectronic element of claim 5, wherein the solder does not touch the base region of any solid metal post.

8. The packaged microelectronic element of claim 4, wherein the fusible metal comprises solder, and the solder touches only a top surface of each solid metal post.

9. The packaged microelectronic element of claim 1, wherein a height of each solid metal post is between 25% and 50% of the distance between the front surface of the microelectronic element and the major surface of the substrate.

10. The packaged microelectronic element of claim 1, wherein a height of each solid metal post is at least 40% of the distance between the front surface of the microelectronic element and the major surface of the substrate.

11. The packaged microelectronic element of claim 1, wherein the solid metal posts and the conductive elements are diffusion-bonded together.

12. The packaged microelectronic element of claim 1, wherein the first and second functions are substantially different.

13. The packaged microelectronic element of claim 1, wherein a slope of horizontal dimension versus vertical location changes abruptly at a boundary between the base and the tip regions of the solid metal posts.

14. The packaged microelectronic element of claim 1, wherein the solid metal posts and the conductive elements consist essentially of copper.

15. The packaged microelectronic element of claim 1, wherein the conductive elements include conductive pads, the pads being joined to the solid metal posts.

16. The packaged microelectronic element of claim 1, wherein the solid metal posts are first solid metal posts and the conductive elements include a plurality of second solid metal posts extending above the major surface and joined to the first solid metal posts, the second posts having top surfaces remote from the major surface of the substrate and edge surfaces extending at substantial angles away from the top surfaces.

17. The packaged microelectronic element of claim 16, wherein the first solid metal posts are joined to the second solid metal posts with a fusible metal.

18. The packaged microelectronic element of claim 17, wherein the fusible metal comprises solder, and the solder covers at least portions of edge surfaces of each solid metal post.

19. The packaged microelectronic element of claim 18, further comprising a plurality of conductive pads located at the front surface, wherein each first solid metal post extends from a respective one of the plurality of conductive pads and the solder does not touch at least one of the plurality of conductive pads.

20. The packaged microelectronic element of claim 17, wherein the fusible metal comprises solder, and the solder touches only a top surface of each solid metal post.

21. The packaged microelectronic element of claim 16, wherein the first and second solid metal posts are diffusion-bonded together.

22. The packaged microelectronic element of claim 16, wherein each second solid metal post includes a base region adjacent the substrate and a tip region, remote from the substrate, the base region and tip region of each second solid metal post having respective concave circumferential surfaces, each second solid metal post having a horizontal dimension which is a third function of vertical location in the base region and which is a fourth function of vertical location in the tip region.

23. The packaged microelectronic element of claim 22, wherein each second post has a width in a direction of the major surface and a height extending from the major surface, wherein the height is at least half of the width.

24. The packaged microelectronic element of claim 22, wherein the first solid metal posts are joined to the second solid metal posts with a fusible metal.

25. The packaged microelectronic element of claim 24, wherein the fusible metal comprises solder, and the solder covers at least portions of edge surfaces of each solid metal post.

26. The packaged microelectronic element of claim 25, further comprising a plurality of conductive pads located at the front surface, wherein each first solid metal post extends from a respective one of the plurality of conductive pads and the solder does not touch at least one of the plurality of conductive pads.

27. The packaged microelectronic element of claim 25, wherein the solder does not touch the base region of any solid metal post.

28. The packaged microelectronic element of claim 24, wherein the fusible metal comprises solder, and the solder touches only a top surface of each solid metal post.

29. The packaged microelectronic element of claim 22, wherein the first and second solid metal posts are diffusion-bonded together.

30. The packaged microelectronic element of claim 22, wherein the first function is the same as the third function and the second function is the same as the fourth function.

31. A packaged microelectronic element, comprising:
   a microelectronic element having a front surface and a plurality of first solid metal posts projecting above the front surface, the first posts having top surfaces remote from the front surface and edge surfaces extending at substantial angles away from the front surface; and
   a substrate having a major surface and a plurality of second solid metal posts extending from the major surface and joined to the first solid metal posts;
   each second solid metal post including a base region adjacent the microelectronic element and a tip region, remote from the microelectronic element, the base region and tip region having respective concave circumferential surfaces;
   each second solid metal post having a horizontal dimension which is a first function of vertical location in the base region and which is a second function of vertical location in the tip region.

32. The packaged microelectronic element of claim 31, wherein each first post has a frustoconical shape.

33. The packaged microelectronic element of claim 31, wherein each second post has a width in a direction of the major surface and a height extending from the major surface, wherein the height is at least half of the width.

34. The packaged microelectronic element of claim 31, wherein the first solid metal posts are joined to the second solid metal posts with a fusible metal.

35. The packaged microelectronic element of claim 34, wherein the fusible metal comprises solder, and the solder covers at least portions of edge surfaces of each solid metal post.

36. The packaged microelectronic element of claim 35, further comprising a plurality of conductive pads located at the front surface, wherein each first solid metal post extends from a respective one of the plurality of conductive pads and the solder does not touch at least one of the plurality of conductive pads.

37. The packaged microelectronic element of claim 34, wherein the fusible metal comprises solder, and the solder touches only a top surface of each solid metal post.

38. The packaged microelectronic element of claim 31, wherein the first and second solid metal posts are diffusion-bonded together.

39. A method of assembling a packaged microelectronic element comprising:
   (a) providing a microelectronic element having a front surface and a plurality of solid metal posts projecting in a vertical direction above the front surface, each solid metal post including a base region adjacent the front surface and a tip region, remote from the front surface, the base region and the tip region having respective concave circumferential surfaces, each solid metal post having a horizontal dimension which is a first function of vertical location in the base region and which is a second function of vertical location in the tip region;
   (b) at least substantially aligning the plurality of solid metal posts with a plurality of conductive elements exposed at a major surface of a substrate; and
   (c) joining the solid metal posts of the microelectronic element with the conductive elements of the substrate.

40. The method of claim 39, wherein step (c) includes heating a fusible metal to a melting temperature, wherein the fusible metal flows onto exposed portions of edge surfaces of the solid metal posts.

41. The method of claim 40, wherein the fusible metal comprises solder, and the solder covers at least portions of edge surfaces of each solid metal post.

42. The method of claim 41, further comprising a plurality of conductive pads located at the front surface, wherein each solid metal post extends from a respective one of the plurality of conductive pads and the solder does not touch at least one of the plurality of conductive pads.

43. The method of claim 41, wherein the solder does not touch the base region of any solid metal post.

44. The method of claim 40, wherein the fusible metal comprises solder, and the solder touches only a top surface of each solid metal post.

45. The method of claim 39, wherein a height of each sold metal post is between 25% and 50% of the distance between the front surface of the microelectronic element and the major surface of the substrate.

46. The method of claim 39, wherein a height of each sold metal post is at least 40% of the distance between the front surface of the microelectronic element and the major surface of the substrate.

47. The method of claim 39, wherein a passivation layer and an underbump metallization layer are deposited over the microelectronic element.

* * * * *